United States Patent
Yoshida et al.

(10) Patent No.: US 12,261,624 B2
(45) Date of Patent: Mar. 25, 2025

(54) ERROR CORRECTION CODING APPARATUS AND ERROR CORRECTION DECODING APPARATUS

(71) Applicant: Mitsubishi Electric Corporation, Tokyo (JP)

(72) Inventors: Hideo Yoshida, Tokyo (JP); Tsuyoshi Yoshida, Tokyo (JP); Yoshiaki Konishi, Tokyo (JP); Kenji Ishii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/492,547

(22) Filed: Oct. 23, 2023

(65) Prior Publication Data
US 2024/0056099 A1    Feb. 15, 2024

Related U.S. Application Data

(60) Division of application No. 17/899,719, filed on Aug. 31, 2022, now Pat. No. 11,901,913, which is a
(Continued)

(30) Foreign Application Priority Data

Apr. 2, 2020    (WO) .................. PCT/JP2020/015223

(51) Int. Cl.
*H03M 13/00*    (2006.01)
*H03M 13/11*    (2006.01)

(52) U.S. Cl.
CPC ...... *H03M 13/1131* (2013.01); *H03M 13/611* (2013.01)

(58) Field of Classification Search
CPC .......... H03M 13/1137; H03M 13/611; H03M 13/1131; H03M 13/1174; H03M 13/118
See application file for complete search history.

(56) References Cited

U.S. PATENT DOCUMENTS 5,699,368 A    12/1997   Sakai et al.
5,745,507 A     4/1998   Chen
(Continued)

FOREIGN PATENT DOCUMENTS

JP    3288883 B2      6/2002
JP    2018-101857 A   6/2018
(Continued)

OTHER PUBLICATIONS

Bocherer, "Probabilistic Signal Shaping for Bit-Metric Decoding," in Proc. IEEE International Symposium on Information Theory (ISIT), Honolulu, HI, USA, Jul. 2014, pp. 431-435.
(Continued)

*Primary Examiner* — Esaw T Abraham
(74) *Attorney, Agent, or Firm* — Birch, Stewart, Kolasch & Birch, LLP

(57) ABSTRACT

An error correction coding apparatus that performs error correction coding using, as an error correction code sequence, a frame of m bits×n symbols input in m-bit parallel, where m and n are positive integers, includes: an error correction coding circuit that performs error correction coding using, as information bits, m bits×n symbols including known bits assigned to a bit sequence specified in the error correction code sequence and generate error correction coded parity bits; and a selector that replaces the known bits of the error correction code sequence with the parity bits.

7 Claims, 19 Drawing Sheets

Related U.S. Application Data continuation of application No. PCT/JP2021/004798, filed on Feb. 9, 2021.

(56) References Cited

U.S. PATENT DOCUMENTS

| | | | | |
|---|---|---|---|---|
| 5,996,104 | A * | 11/1999 | Herzberg | H03M 13/2957 |
| | | | | 714/787 |
| 7,096,406 | B2 * | 8/2006 | Kanazawa | G06F 11/1072 |
| | | | | 714/763 |
| 7,167,110 | B2 | 1/2007 | Noda | |
| 7,870,467 | B2 * | 1/2011 | Yoshida | G11B 20/1833 |
| | | | | 714/755 |
| 7,912,029 | B2 * | 3/2011 | Jang | H04J 13/004 |
| | | | | 370/342 |
| 8,179,955 | B2 * | 5/2012 | Taylor | H04L 27/2647 |
| | | | | 375/230 |
| 8,230,292 | B2 | 7/2012 | Fujiwara et al. | |
| 8,527,834 | B2 * | 9/2013 | Nakao | H04L 1/0041 |
| | | | | 714/758 |
| 8,745,463 | B2 * | 6/2014 | Amato | H03M 13/05 |
| | | | | 714/755 |
| 10,691,539 | B2 * | 6/2020 | Zamir | G06F 3/064 |
| 11,095,309 | B2 * | 8/2021 | Ishii | H03M 13/1185 |
| 11,581,906 | B1 * | 2/2023 | Berman | H03M 13/45 |
| 2008/0141104 | A1 | 6/2008 | Miyazaki et al. | |
| 2014/0164876 | A1 * | 6/2014 | Gasanov | H03M 13/6343 |
| | | | | 714/769 |

FOREIGN PATENT DOCUMENTS

| | | |
|---|---|---|
| WO | WO 2007/020677 A1 | 2/2007 |
| WO | WO 2011/091850 A1 | 8/2011 |

OTHER PUBLICATIONS

Extended European Search Report dated Mar. 20, 2023 issued in corresponding European Patent Application No. 21779027.8.
Imai et al., "A New Multilevel Coding Method Using Error-Correcting Codes", IEEE Transactions on Information Theory, May 1977, vol. IT-23, No. 3, pp. 371-377.
International Search Report for PCT/JP2021/004798 mailed on May 11, 2021.
Japanese Notice of Reasons for Refusal, issued in JP Patent Application No. 2021-537043, dated Nov. 2, 2021.
Ohno et al., "Watermarking and Blind Detection Method for Anonymized Data", IEICE Technical Report, Mar. 2017, vol. 116, No. 510, pp. 315-320.
Ungerboeck, "Channel Coding with Multilevel/Phase Signals", IEEE Transactions on Information Theory, Jan. 1982, vol. IT-28, No. 1, pp. 55-67.
Written Opinion of the International Searching Authority for PCT/JP2021/004798 mailed on May 11, 2021.

* cited by examiner

FIG.1
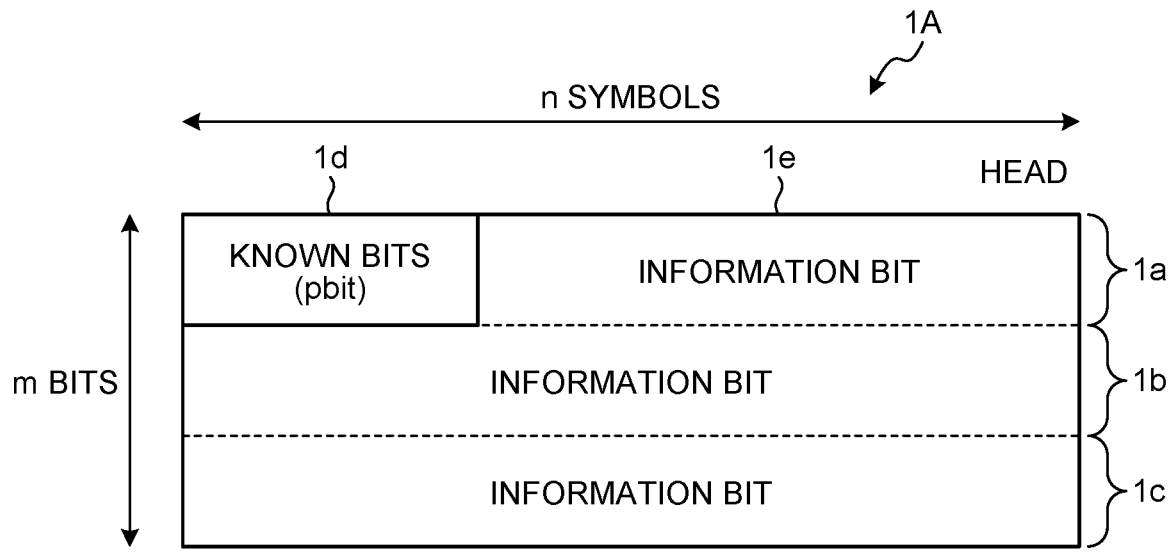
(a) BEFORE CODING
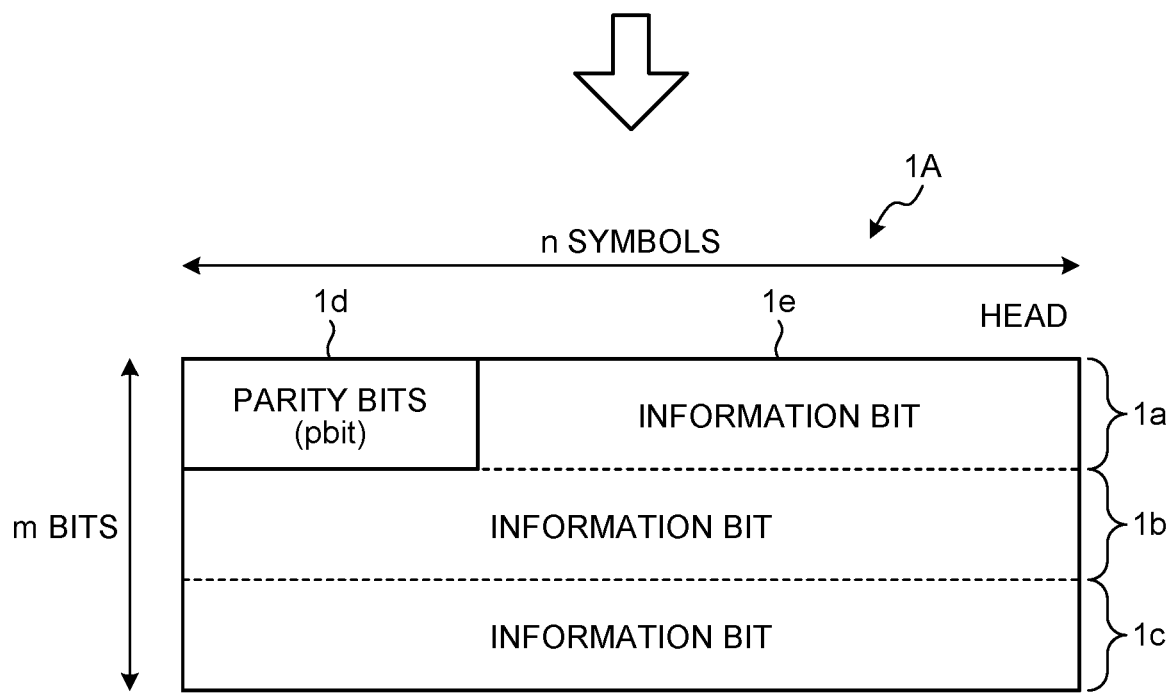
(b) AFTER CODING

FIG.6
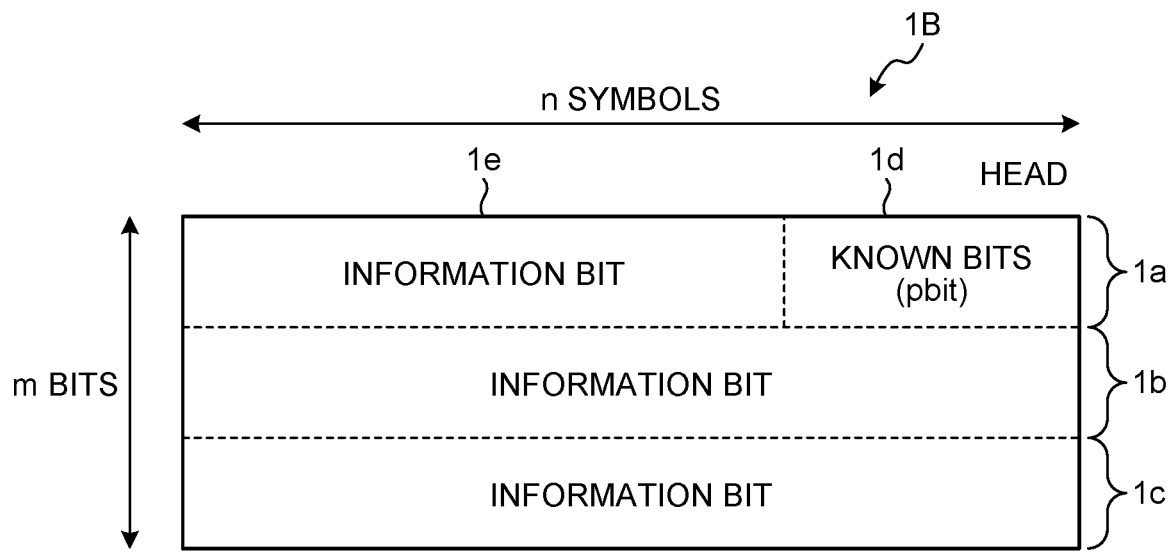
(a) BEFORE CODING
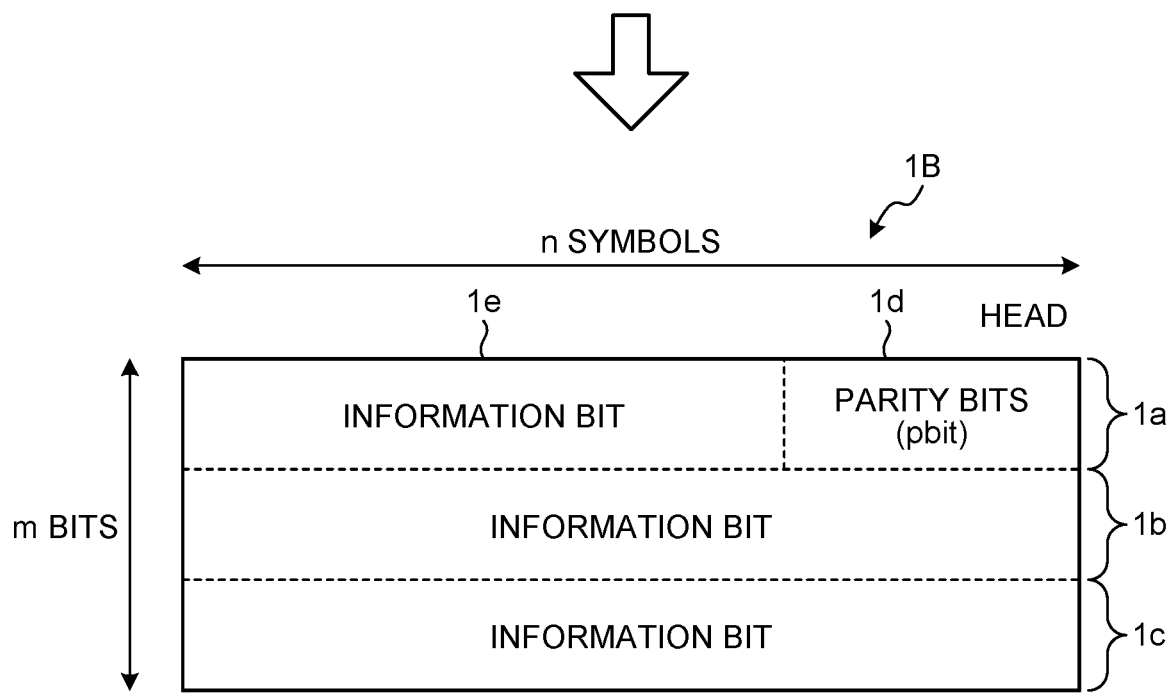
(b) AFTER CODING

FIG.11
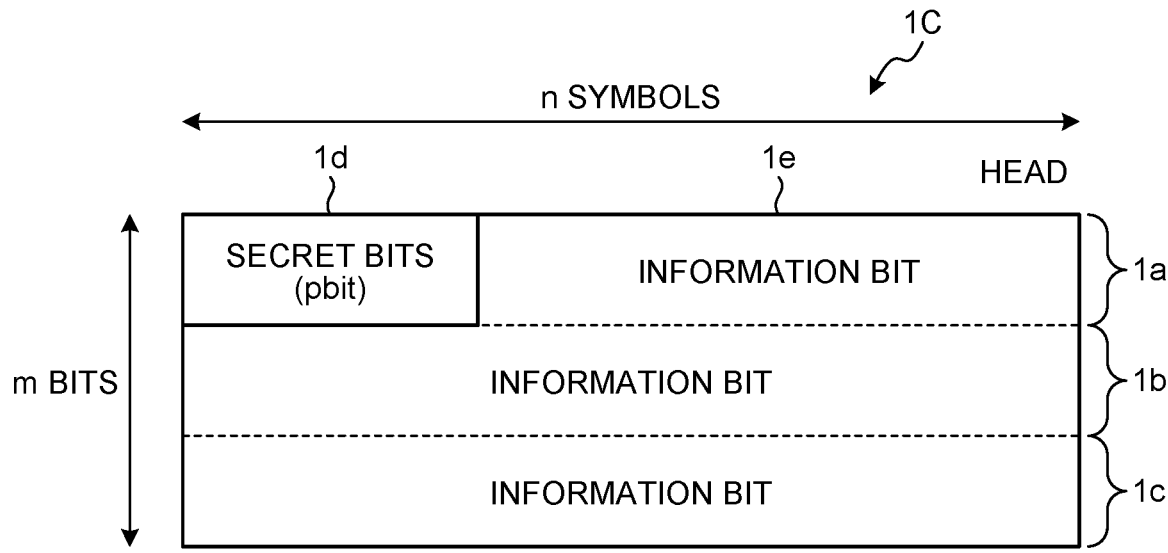
(a) BEFORE CODING
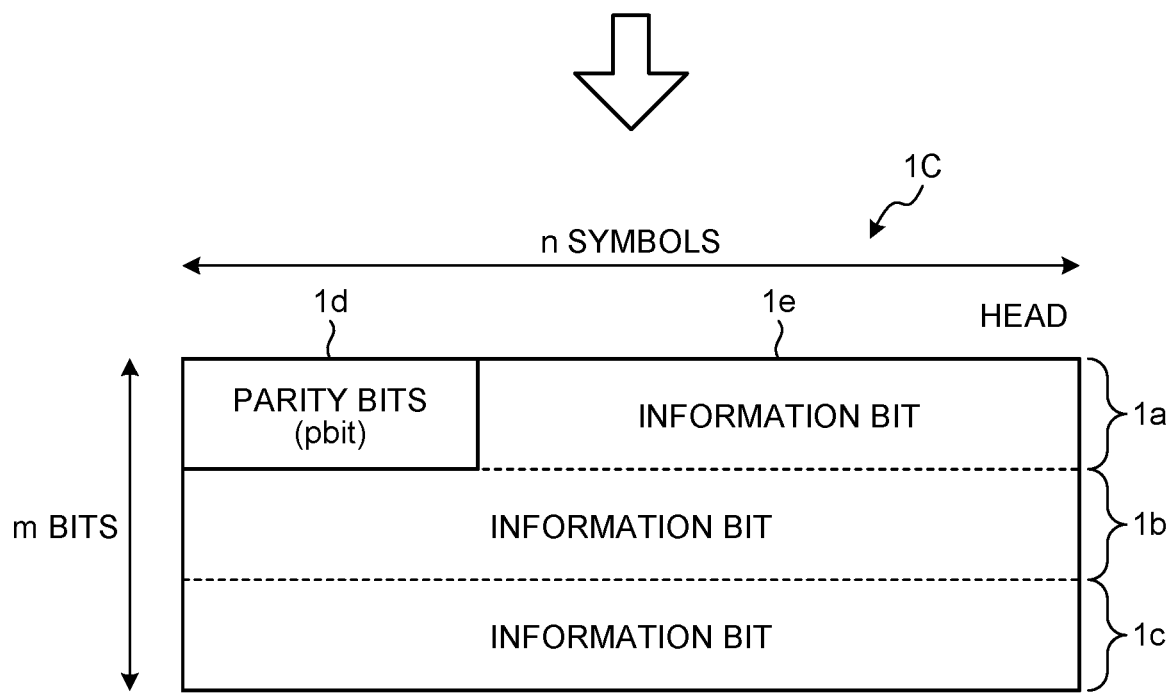
(b) AFTER CODING

ERROR CORRECTION CODING APPARATUS AND ERROR CORRECTION DECODING APPARATUS

CROSS-REFERENCE TO RELATED APPLICATION

This application is a divisional of U.S. application Ser. No. 17/899,719, filed Aug. 31, 2022 (now U.S. Pat. No. 11,901,913 issued Feb. 13, 2024), which is a continuation of PCT International Application No. PCT/JP2021/004798, filed on Feb. 9, 2021, which claims priority under 35 U.S.C. 119 (a) to Patent Application No. PCT/JP2020/015223, filed in Japan on Apr. 2, 2020, all of which are hereby expressly incorporated by reference into the present application.

BACKGROUND OF THE INVENTION

1. Field of the Invention

The present disclosure relates to an error correction coding apparatus that performs an error correction coding process, an error correction decoding apparatus, a control circuit, a storage medium, an error correction coding method, and an error correction decoding method.

2. Description of the Related Art

High-speed transmission devices such as optical transmission systems typically employ an error correction codes as an effective method for providing higher transmission capacity and long-distance transmission. The error correction code is a technology used in a wired communication system, a wireless communication system, a storage device, etc. The error correction code is a technology for adding a redundant bit to digital data sent out by a transmission device, such that even if an error occurs in received data, a reception device can correct the error. Various schemes such as a block code such as a Hamming code, a Bose-Chaudhuri-Hocquenghem (BCH) code, a Reed-Solomon (RS) code, and a low-density parity-check (LDPC) code, and a combination thereof, i.e., a product code and a concatenated code are used as error correction coding and decoding schemes.

Application of an error correction code enables detection and correction of an error that has occurred in a transmission path. Unfortunately, the number of correctable error bits is limited. In addition, the number of correctable error bits varies depending on error correction performance of an error correction coding scheme and a decoding scheme. For an error correction code, transmission data including an overhead etc. defining a frame is referred to as an information bit. A redundant bit added to an information bit is referred to as a parity bit. Such a parity bit is calculated from an information bit, and a calculation method thereof varies depending on the error correction coding scheme. A bit string obtained by combining an information bit and a parity bit is referred to as a code word.

For an error correction code called a block code, a parity bit is calculated from an information bit in units of the number of bits set in advance. That is, the number of information bits and the number of parity bits in one code word are determined in advance, and are referred to as an information bit length and a parity bit length, respectively. Bits of an error correction code are separated into information bits and parity bits. The thus configured code is referred to as a systematic code. The number of bits of a code word is referred to as a code length.

In metro-core optical transmission systems used for submarine cables and inter-city communication, there is a significant demand for an increase in transmission capacity and an increase in transmission distance. To address such a demand, a powerful error correction code is devised and applied to high-speed transmission such as transmission at several hundred Gbps to 1 Tbps. In recent years, metro-core optical transmission systems uses digital coherent optical transmission for high-speed transmission. In the digital coherent optical transmission, multiple bits are modulated into one modulation symbol under a multilevel modulation scheme such as 64 quadrature amplitude modulation (QAM), and transmitted.

In multilevel modulation such as 64 QAM, error rates are different among different bits of a symbol. A multilevel coding scheme and a coding and modulation scheme have been devised, under which scheme, error correction coding is performed for each of bit sequences assigned to a symbol depending on characteristics of the bits. Japanese Patent No. 3288883, which discloses a technique for performing error correction coding and decoding, teaches a coding processing operation or a decoding processing operation on input of multiple bits in order to perform a high-speed process particularly for block codes such as a BCH code, an RS code, and an LDPC code. For a recently developed method, furthermore, a bit sequence of a multilevel modulation symbol having a large bit error rate is subjected to such a bit operation as probabilistic signal shaping (hereinafter referred to as PS) to reduce a symbol error rate. A probabilistic signal shaping operation is performed before error correction coding, and parity bits generated by the error correction coding are assigned to a multilevel modulation symbol having a small bit error rate.

In recent optical transmission systems, an increase in speed regarding processing ability is required with an increase in transmission capacity. Although the speed can be increased by inputting bit sequences of a multilevel modulation symbol as they are in parallel and performing a coding process thereon, it is inefficient to employ a scheme that assigns one bit sequence of a multilevel modulation symbol to a parity of sequentially-coded type. By performing block-coding for each of the bit sequences of the multilevel modulation symbol, a parallel process thereof can be performed, but a coding circuit is required for each of the bit sequences, and thus a circuit scale is increased.

In Japanese Patent No. 3288883, multiple bits of a multilevel modulation symbol can be input in parallel and a parallel batch coding process can be performed thereon, but also for a parity by error correction coding, multiple bits of a symbol are output in parallel. A specific bit sequence of the multilevel modulation symbol is adjusted by PS, etc. before the error correction coding. In this case, the parity by the error correction coding is assigned to a specific bit sequence not subjected to the probabilistic signal shaping, and a frame adjustment memory for performing frame shaping is provided before and after a coding processing circuit, which undesirably leads to an increase in circuit scale.

SUMMARY OF THE INVENTION

To solve the above problem, the present disclosure provides an error correction coding apparatus to perform error correction coding using, as an error correction code sequence, a frame of m bits×n symbols input in m-bit parallel, where m and n are positive integers. The apparatus comprises: an error correction coding circuit to perform error correction coding using, as information bits, m bits×n symbols including known bits assigned to a bit sequence specified in the error correction code sequence and generate error correction coded parity bits; and a selector to replace the known bits of the error correction code sequence with the parity bits.

BRIEF DESCRIPTION OF THE DRAWINGS

FIG. 1 is a diagram illustrating an example configuration of a frame used in an error correction code according to a first embodiment;

FIG. 6 is a diagram illustrating an example configuration of a frame used in an error correction code according to a second embodiment;

FIG. 11 is a diagram illustrating an example configuration of a frame used in an error correction code according to a third embodiment;

DETAILED DESCRIPTION OF THE PREFERRED EMBODIMENTS

An error correction coding apparatus, an error correction decoding apparatus, a control circuit, a storage medium, an error correction coding method, and an error correction decoding method according to embodiments of the present disclosure will be hereinafter described in detail with reference to the drawings. The disclosure is not limited to the embodiments.

First Embodiment

FIG. 1 is a diagram illustrating an example configuration of a frame 1A used in an error correction code according to a first embodiment. Assume that the error correction code is a block code such as a BCH code, an RS code, or an LDPC code, which is a systematic code having information bits and parity bits separated from the information bits. In FIG. 1, there is an error correction code sequence in the frame 1A of m bits× n symbols, and the number of bits m of a multilevel modulation symbol is set to 3. Note that m and n are positive integers. The frame 1A includes a most significant bit (MSB) 1a. The MSB 1a has an information bit region 1e assigned an information bit, and a bit region 1d for p bits. As illustrated in FIG. 1(a), for example, known p bits of zero are assigned to the bit region 1d before error correction coding. In the present embodiment, known bits are also treated as information bits of the error correction code sequence, and the error correction coding is performed on the information bits of m bits× n symbols. In addition, as illustrated in FIG. 1(b), after the error correction coding, p parity bits are assigned to the bit region 1d. The frame 1A includes an intermediate bit 1b and a least significant bit (LSB) 1c. The intermediate bit 1b and the LSB 1c are defined only by information bits converted by PS, for example.

In the present embodiment, when the p parity bits are generated by the error correction coding in the error correction coding apparatus to be described later, the known bits of the bit region 1d for p bits in the MSB 1a are replaced with the generated parity bits. The information bits of the information bit region 1e of the MSB 1a, the intermediate bit 1b, and the LSB 1c are output as they are to the subsequent stage of the error correction coding apparatus. That is, in the present embodiment, the code length of the error correction code is m×n+p bits.

Figure 2:
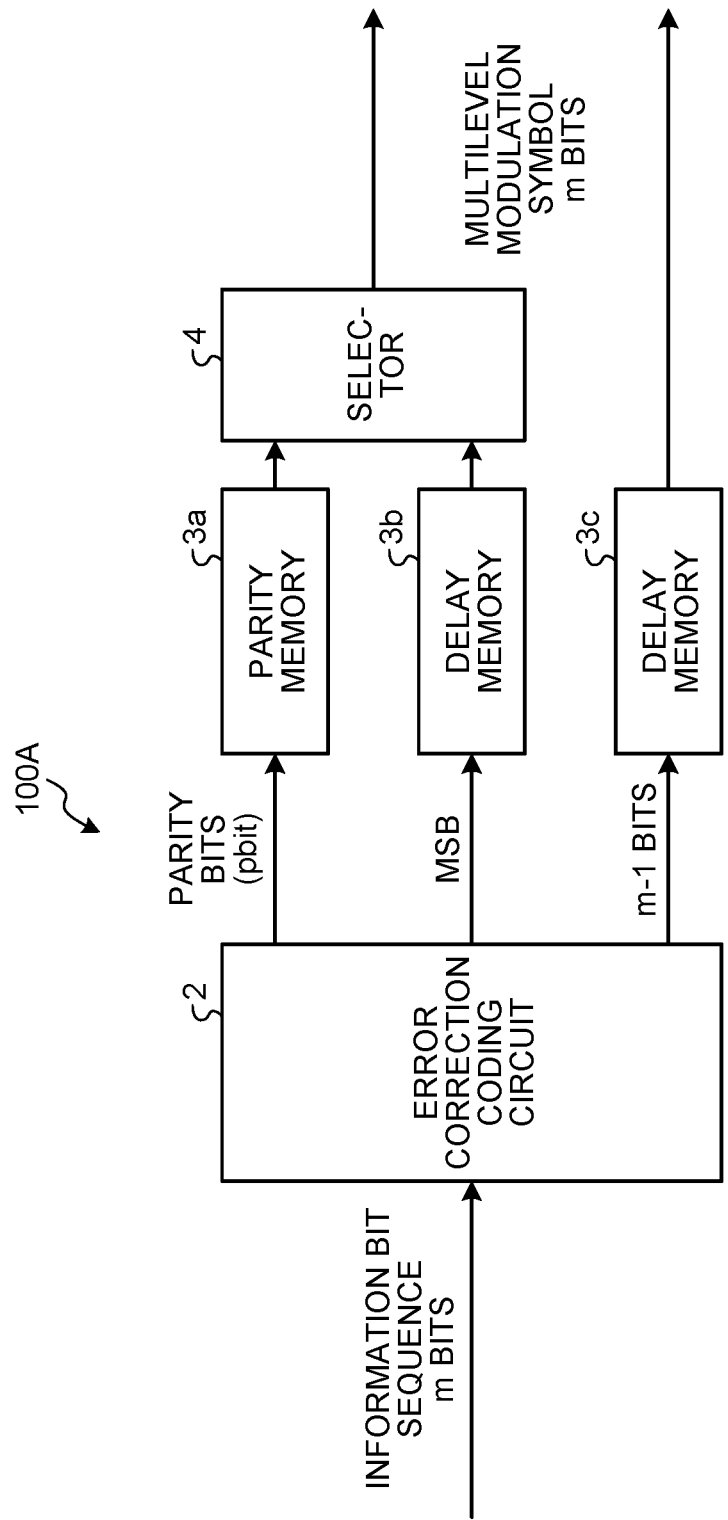
FIG. 2 is a block diagram illustrating an example configuration of an error correction coding apparatus according to the first embodiment.
Figure 3:
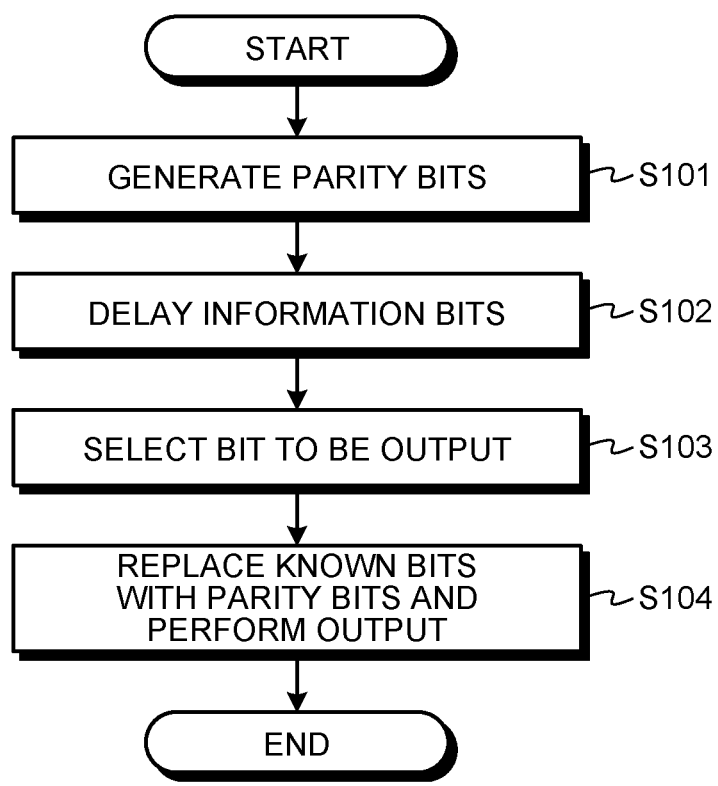
FIG. 3 is a flowchart illustrating an operation of the error correction coding apparatus according to the first embodiment.

A configuration and an operation of an error correction coding apparatus that performs error correction coding on the frame 1A before error correction coding illustrated in FIG. 1(a) will be described. FIG. 2 is a block diagram illustrating an example configuration of an error correction coding apparatus 100A according to the first embodiment. FIG. 3 is a flowchart illustrating an operation of the error correction coding apparatus 100A according to the first embodiment. The error correction coding apparatus 100A is an apparatus that performs error correction coding on the frame 1A before error correction coding illustrated in FIG. 1(a). Three bits of an information bit sequence are input to the error correction coding apparatus 100A in parallel in accordance with the number of bits m of the multilevel modulation symbol, which number is 3. The assumption is that the bit region 1d of the frame 1A to be input to the error correction coding apparatus 100A is previously assigned p known bits, which is not exhaustive. For example, when the frame 1A is input to the error correction coding apparatus 100A, the error correction coding apparatus 100A may replace bits assigned to the bit region 1d, with known bits.

The error correction coding apparatus 100A performs error correction coding using a frame of m bits× n symbols input in m-bit parallel as an error correction code sequence. The error correction coding apparatus 100A includes an error correction coding circuit 2, a parity memory 3a, delay memories 3b and 3c, and a selector 4.

The error correction coding circuit 2 performs systematic block error correction coding. The error correction coding circuit 2 generates parity bits of an error correction code sequence using input bits including known bits as information bits (step S101). Regarding a parity bit generation process, the error correction coding circuit 2 may perform the process serially, or can easily perform a parallel operation as all the m bits are information bits. In the serial process, the error correction coding circuit 2 needs a clock frequency that is m times the clock frequency of m-bit symbol input, but when performing an m-bit parallel processing operation using the linearity of an error correction code operation, a coding operation can be performed at the clock frequency of symbol input.

The error correction coding circuit 2 outputs the input m information bits as they are to the delay memories 3b and 3c. Specifically, the error correction coding circuit 2 outputs the information bit of the information bit region 1e of the MSB 1a to the delay memory 3b, and outputs the information bit of the intermediate bit 1b and the information bit of the LSB 1c, that is, m−1 information bits, to the delay memory 3c. As discussed above, the error correction coding circuit 2 performs the error correction coding, using, as information bits, m bits× n symbols and generates error correction coded parity bits, the m bits× n symbols including the known bits assigned to the bit sequence specified in the error correction code sequence.

The delay memories 3b and 3c delay the m information bits at least until the parity bits of the error correction code sequence are generated by the error correction coding circuit 2 (step S102).

The error correction coding circuit 2 can generate p parity bits of the error correction code sequence when all the information bits defining the error correction code sequence are input to the error correction coding circuit 2. The error correction coding circuit 2 stores the generated parity bits in the parity memory 3a. Consequently, even if an m-bit information bit sequence, which is the next code sequence, is input to the error correction coding circuit 2, the error correction coding apparatus 100A can generate parity bits with the same error correction coding circuit 2.

The parity memory 3a outputs the parity bits in accordance with a sequence order of the error correction code sequence. Specifically, the delay memory 3b outputs a leading bit of the known bits at a timing when a leading bit of the parity bits is output from the parity memory 3a. In addition, at the timing when the leading bit of the parity bits is output from the parity memory 3a, the delay memory 3c outputs information bits input simultaneously with the leading bit of the known bits and corresponding to the intermediate bit 1b and the LSB 1c illustrated in FIG. 1.

The selector 4 is a two-input-one-output selector. The selector 4 selects, as a bit to be output, a parity bit output from the parity memory 3a or a bit of the MSB 1a output from the delay memory 3b (step S103). Specifically, in a case where a parity bit is output from the parity memory 3a and a known bit is output from the delay memory 3b, the selector 4 selects the parity bit from the parity memory 3a and outputs the parity bit. Otherwise, that is, in a case where the information bit of the information bit region 1e is output from the delay memory 3b, the selector 4 selects the information bit from the delay memory 3b and outputs the information bit. Thus, the selector 4 replaces the known bits of the error correction code sequence with the parity bits.

As a result, the error correction coding apparatus 100A can replace the known bits in the bit region 1d of the pre-error-correction-coding frame 1A illustrated in FIG. 1(a) with the parity bits and output an m-bit multilevel modulation symbol (step S104).

Consequently, the error correction coding apparatus 100A can easily perform the error correction coding operation with low latency, at a high speed, and with a reduced circuit scale, by an m-bit parallel operation without losing the bit configuration of the multilevel modulation symbol on an input side.

Figure 4:
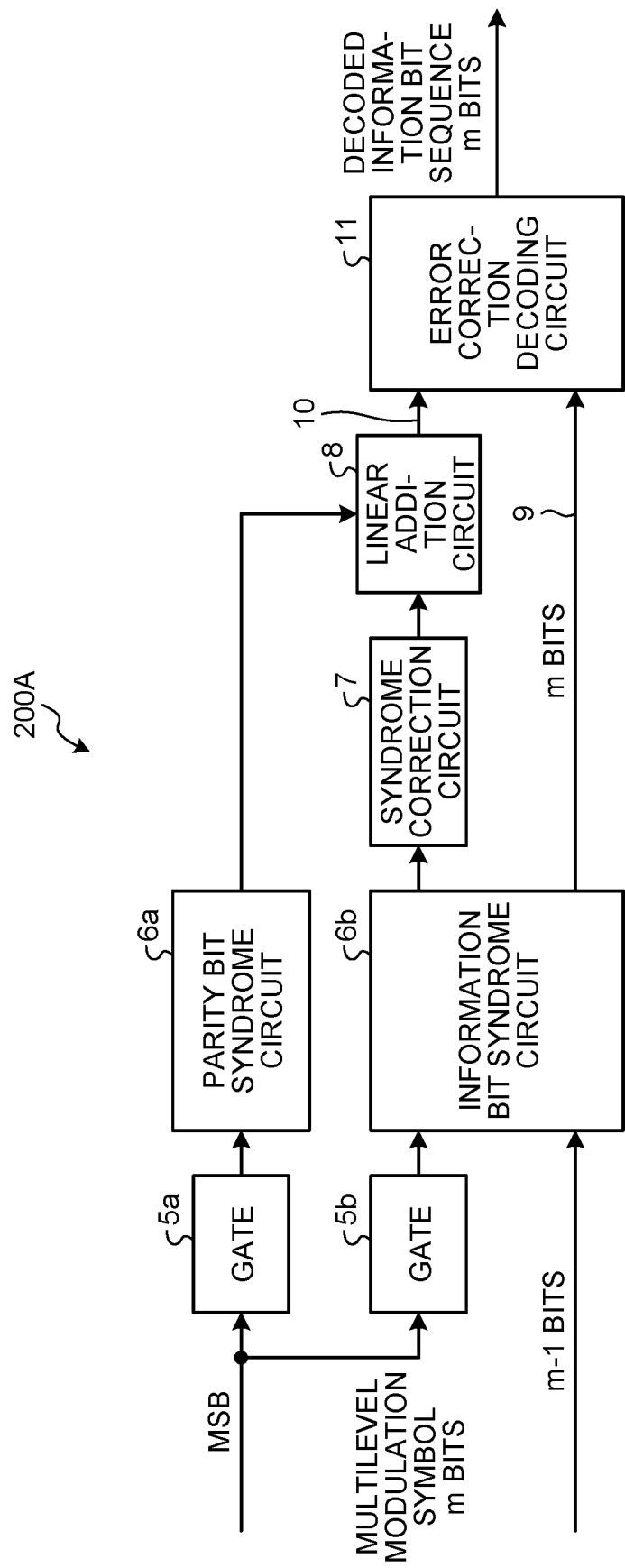
FIG. 4 is a block diagram illustrating an example configuration of an error correction decoding apparatus according to the first embodiment.
Figure 5:
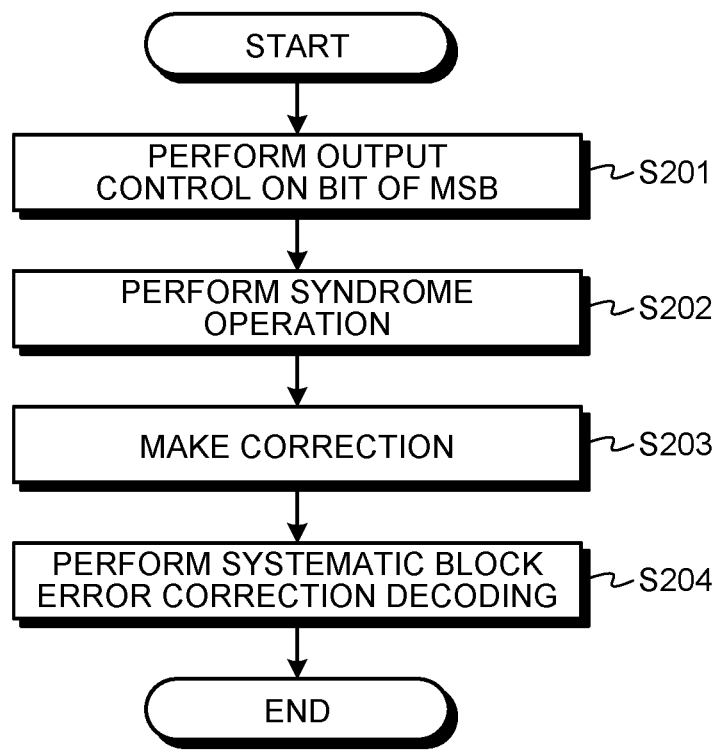
FIG. 5 is a flowchart illustrating an operation of the error correction decoding apparatus according to the first embodiment.

Next, a configuration and an operation of an error correction decoding apparatus that receives and decodes the multilevel modulation symbol transmitted from the error correction coding apparatus 100A will be described. FIG. 4 is a block diagram illustrating an example configuration of an error correction decoding apparatus 200A according to the first embodiment. FIG. 5 is a flowchart illustrating an operation of the error correction decoding apparatus 200A according to the first embodiment. The error correction decoding apparatus 200A is an apparatus that performs error correction decoding on the post-error-correction-coding frame 1A illustrated in FIG. 1(b), that is, the multilevel modulation symbol input in m-bit parallel. Three bits are input to the error correction decoding apparatus 200A in parallel in accordance with the number of bits m of the multilevel modulation symbol, which number is 3. The error correction decoding apparatus 200A includes gates 5a and 5b, a parity bit syndrome circuit 6a, an information bit syndrome circuit 6b, a syndrome correction circuit 7, a linear addition circuit 8, and an error correction decoding circuit 11.

In accordance with the bits of the received multilevel modulation symbol, the gates 5a and 5b perform output control on a bit of the MSB 1a including the bit region 1d assigned the parity bits (step S201). Specifically, in a case where the error correction coded parity bits assigned to the bit region 1d illustrated in FIG. 1(b) are input to the gate 5a, the gate 5a passes the parity bits therethrough and outputs the parity bits to the parity bit syndrome circuit 6a. In a case where the error correction coded parity bits assigned to the bit region 1d illustrated in FIG. 1(b) are input to the gate 5b, the gate 5b outputs, to the information bit syndrome circuit 6b, the known bits that were assigned to the bit region 1d illustrated in FIG. 1(a). In a case where the known bits are all 0, for example, the gate 5b outputs "0" to the information bit syndrome circuit 6b. In a case where the information bit of the information bit region 1e illustrated in FIG. 1 is input to the gate 5b, the gate 5b passes the information bit therethrough and outputs the information bit to the information bit syndrome circuit 6b.

The error correction decoding apparatus 200A outputs m−1 information bits corresponding to the intermediate bit 1b and the LSB 1c illustrated in FIG. 1, to the information bit syndrome circuit 6b in parallel with the output of the information bit of the information bit region 1e from the gate 5b to the information bit syndrome circuit 6b.

When the frame 1A after error correction coding illustrated in FIG. 1(b) is input to the parity bit syndrome circuit 6a, the parity bit syndrome circuit 6a performs a syndrome operation, that is, calculates syndrome data, of parity bits included in the multilevel modulation symbol. Similarly, the information bit syndrome circuit 6b performs a syndrome operation, that is, calculates syndrome data, of information bits included in the multilevel modulation symbol (step S202). Specifically, the information bit syndrome circuit 6b performs a syndrome operation of the information bits included in the multilevel modulation symbol having known bits replacing the parity bits included in the multilevel modulation symbol, and performs a syndrome operation of that replacing known bits. As illustrated in FIG. 4, there is a difference in widths of bits input in parallel to the parity bit syndrome circuit 6a and the information bit syndrome circuit 6b.

In a case where there is a correction of the syndrome operation corresponding to input parity bits in syndrome data about information bits including known bits in the information bit syndrome circuit 6b, the syndrome correction circuit 7 corrects, through a linear operation process, the syndrome data calculated by the information bit syndrome circuit 6b (step S203). The linear addition circuit 8 can obtain syndrome data 10 as an error correction code sequence by linearly adding the syndrome data calculated by the parity bit syndrome circuit 6a and the syndrome data corrected by the syndrome correction circuit 7.

The error correction decoding circuit 11 performs systematic block error correction decoding (step S204). Specifically, using the syndrome data 10 obtained from the linear addition circuit 8 and m bits of information bits 9 acquired from the information bit syndrome circuit 6b, the error correction decoding circuit 11 decodes an m-bit information bit sequence, i.e., corrects an error with a specified delay under a decoding scheme corresponding to the error correction coding scheme employed by the error correction coding apparatus 100A. The error correction decoding circuit 11 outputs the thus decoded information bit sequence. As discussed above, the error correction decoding circuit 11 performs error correction decoding, indirectly, by using the syndrome data calculated by the parity bit syndrome circuit 6a and the information bit syndrome circuit 6b.

The error correction decoding circuit 11 outputs the decoded information bit sequence, but the decoded information bit sequence also includes the known bits before coding in FIG. 1(a). The known bits, which include no error, does not affect the error correction capability.

The error correction decoding circuit 11 does not output the error correction coded parity bits, but can output a result of correction to the parity bits by the parity bit syndrome circuit 6a outputting the parity bits to the error correction decoding circuit 11. In this case, the p parity bits are desirably output in units of m bits, and by performing overclocking corresponding to at least [p/m], it is possible to estimate and search for an error position and to efficiently perform a correction process in m-bit parallel. Note that the square brackets "[ ]" indicate rounding up.

Consequently, the error correction decoding apparatus 200A can easily perform the error correction decoding operation with low latency, at a high speed, and with a reduced circuit scale, by an m-bit parallel operation without losing the bit configuration of the multilevel modulation symbol on an input side.

Note that, in the present embodiment, the number of bits m of the multilevel modulation symbol is set to 3, but m may be other number than 3. The same applies even where the multilevel modulation symbol having Mm bits is input to and output from the error correction coding apparatus 100A and the error correction decoding apparatus 200A. "Mm" is M times m. M is a positive integer. An information bit length is an integral multiple of Mm bits including the known bits. Furthermore, p bits as an error correction coded parity bit length is also desirably an integral multiple of M bits. In a case where the p bits cannot be divided by M bits, a zero-fill bit is added, for example, so that the p bits can be divided by M bits.

Although the frame 1A in the present embodiment is illustrated in FIG. 1 as a single error correction code sequence, the frame 1A may be defined by a plurality of error correction code sequences. In a case where the number of bits of the frame input to and output from the error correction coding apparatus 100A and the error correction decoding apparatus 200A is M times m, i.e., "Mm", the frame is defined by parallel-arranged error correction code parameters with divisible M, thereby enhancing burst error tolerance in the multilevel modulation symbol. For example, the number of bits input to the error correction coding apparatus 100A in parallel is m bits or a multiple of m bits, and the information bit length is divisible by m bits or a multiple of m bits. In that case, the error correction coding circuit 2 generates parity bits by a simultaneous operation using bits input in parallel.

In addition, although the present embodiment has been described as to the configuration for a single error correction code, an additional error correction code as an inner code is applicable to the information bit of the LSB 1c of FIG. 1 when the incidence of bit errors is high in the LSB 1c, for example. A parity bit generated by the inner code can also be included in the bit region 1d illustrated in FIG. 1.

As described above, according to the present embodiment, a plurality of bits corresponding to the multilevel modulation symbol or a multiple of these plural bits is input to the error correction coding apparatus 100A. The error correction coding apparatus 100A assigns the known bits to a portion of those bits, to which portion the error correction coded parity bits are to be assigned. The error correction coding apparatus 100A performs coding through a multiple-bit parallel process treating the known bits as the information bits in units of the plurality of bits corresponding to the multilevel modulation symbol or the input multiple of the plurality of bits. The information bits other than the known bits in the portion, to which portion the error correction coded parity bits are to be assigned, are output as they are by the error correction coding apparatus 100A. The error correction coding apparatus 100A replaces the known bits with the error correction coded parity bits, and outputs the error correction coded parity bits.

The error correction decoding apparatus 200A performs a syndrome operation, replacing the error correction coded parity bits with the known bits in the input plurality of bits corresponding to the multilevel modulation symbol or the input multiple of these plural bits. Separately from this syndrome operation, the error correction decoding apparatus 200A performs a syndrome operation of the error correction coded parity bits. The error correction decoding apparatus 200A performs the decoding process by replacing the parity bits with the known bits, correcting the syndrome data obtained by the syndrome operation, linearly adding the corrected syndrome data and the syndrome data obtained on the error correction coded parity bits, and obtaining syndrome data on the error correction code sequence.

Consequently, the error correction coding apparatus 100A performs the parallel process of the plurality of bits without changing the configuration of the input plurality of bits corresponding to the multilevel modulation symbol or the input multiple of the plurality of bits, thereby performing the error correction coding process with low latency and at a high speed, shortening coding processing latency as well as preventing an increase in circuit scale. Similarly, the error correction decoding apparatus 200A performs the parallel process of the plurality of bits without changing the configuration of the input plurality of bits corresponding to the multilevel modulation symbol or the input multiple of the plurality of bits, thereby performing the error correction decoding process with low latency and at a high speed, shortening coding processing latency as well as preventing an increase in circuit scale.

Second Embodiment

In the first embodiment, the frame is configured so that the error correction code sequence including the parity bits fits within the m-bit multilevel modulation symbol×n symbols, but error correction code sequences may be successively transmitted. In the second embodiment, when the error correction code sequences are successively transmitted, the parity bits generated by inputting the m parallel information bits including the known bits are to replace the known bits of the next error correction code sequence. Consequently, the coding process can be performed with low latency. Errors in the multilevel modulation symbol can be distributed as the error correction coded parity bits are assigned to a symbol different from a symbol to which the information bits are assigned.

FIG. 6 is a diagram illustrating an example configuration of a frame 1B used in an error correction code according to the second embodiment. In the case of the frame 1B, known bits of a frame of the next one of the successively transmitted error correction code sequences is replaced with parity bits generated in a preceding error correction code sequence. The frame 1B illustrated in FIG. 6 is the same in configuration as the frame 1A illustrated in FIG. 1, except that the MSB 1a in which to arrange the parity bits of the error correction code sequence has the bit region 1d assigned the known bits before coding and the information bit region 1e, the regions 1d, 1e being arranged in the order opposite to the order of arrangement of the bit region 1d and the information region 1e of the frame 1A. In the frame 1B illustrated in FIG. 6, the bit region 1d assigned the known bits before coding is disposed at the head of the error correction code sequence.

Figure 7:
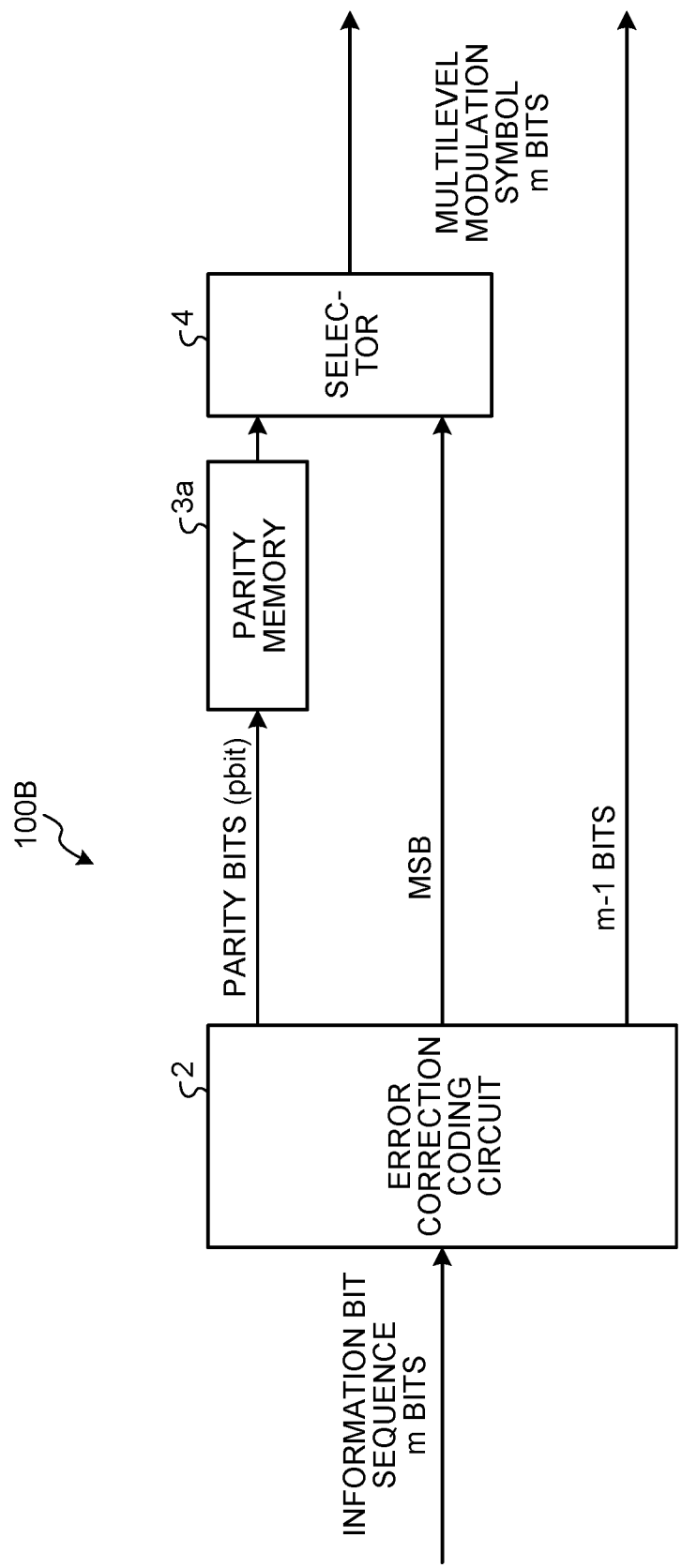
FIG. 7 is a block diagram illustrating an example configuration of an error correction coding apparatus according to the second embodiment.
Figure 8:
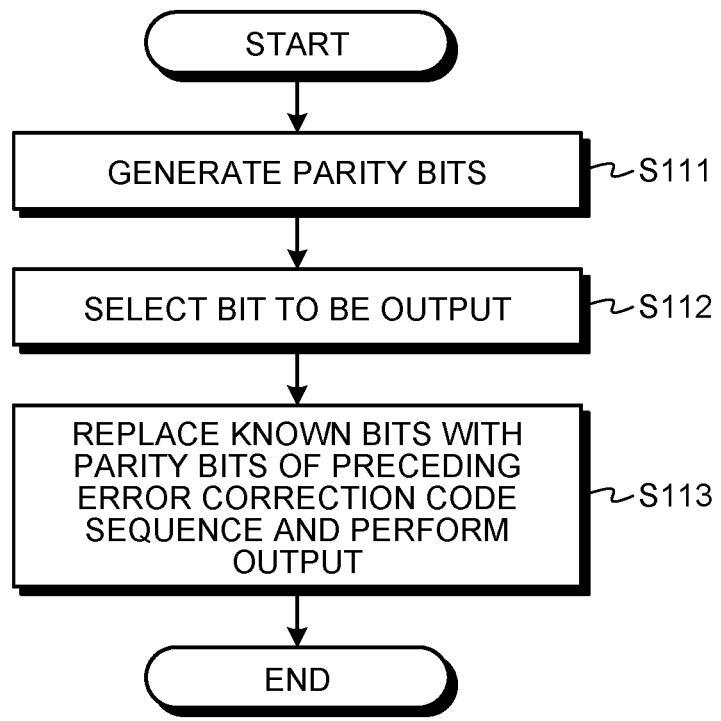
FIG. 8 is a flowchart illustrating an operation of the error correction coding apparatus according to the second embodiment.

A configuration and an operation of an error correction coding apparatus that performs error correction coding on the frame 1B before error correction coding illustrated in FIG. 6(a) will be described. FIG. 7 is a block diagram illustrating an example configuration of an error correction coding apparatus 100B according to the second embodiment. FIG. 8 is a flowchart illustrating an operation of the error correction coding apparatus 100B according to the second embodiment. The error correction coding apparatus 100B is obtained by removing the delay memories 3b and 3c from the error correction coding apparatus 100A illustrated in FIG. 2.

In the error correction coding apparatus 100B, the error correction coding circuit 2 generates parity bits of the error correction code sequence (step S111), and stores the parity bits in the parity memory 3a. The parity memory 3a outputs the parity bits in accordance with a sequence order of the error correction code sequence. Specifically, at the timing when the leading bit of the parity bits is output from the parity memory 3a, the error correction coding circuit 2 outputs, in parallel, first data of the known bits in the bit region 1d of the MSB 1a of the next error correction code sequence, the information bit of the intermediate bit 1b and the information bit of the LSB 1c input in parallel.

The selector 4 selects, as a bit to be output, a parity bit output from the parity memory 3a or a bit of the MSB 1a output from the error correction coding circuit 2 (step S112). Specifically, in a case where a parity bit is output from the parity memory 3a and a known bit is output from the error correction coding circuit 2, the selector 4 selects the parity bit from the parity memory 3a and outputs the parity bit. Otherwise, that is, in a case where the information bit of the information bit region 1e is output from the error correction coding circuit 2, the selector 4 selects the information bit from the error correction coding circuit 2 and outputs the information bit. Thus, the selector 4 replaces the known bits of a second error correction code sequence subsequent to a first error correction code sequence with the parity bits generated from the first error correction code sequence by the error correction coding circuit 2.

As a result, the error correction coding apparatus 100B can replace the known bits in the bit region 1d of the frame 1B before error correction coding illustrated in FIG. 6(a) with the parity bits of the preceding error correction code sequence and output the m-bit multilevel modulation symbol (step S113).

Consequently, the error correction coding apparatus 100B can easily perform the error correction coding operation with low latency, at a high speed, and with a reduced circuit scale, by an m-bit parallel operation without losing the bit configuration of the multilevel modulation symbol on an input side.

Figure 9:
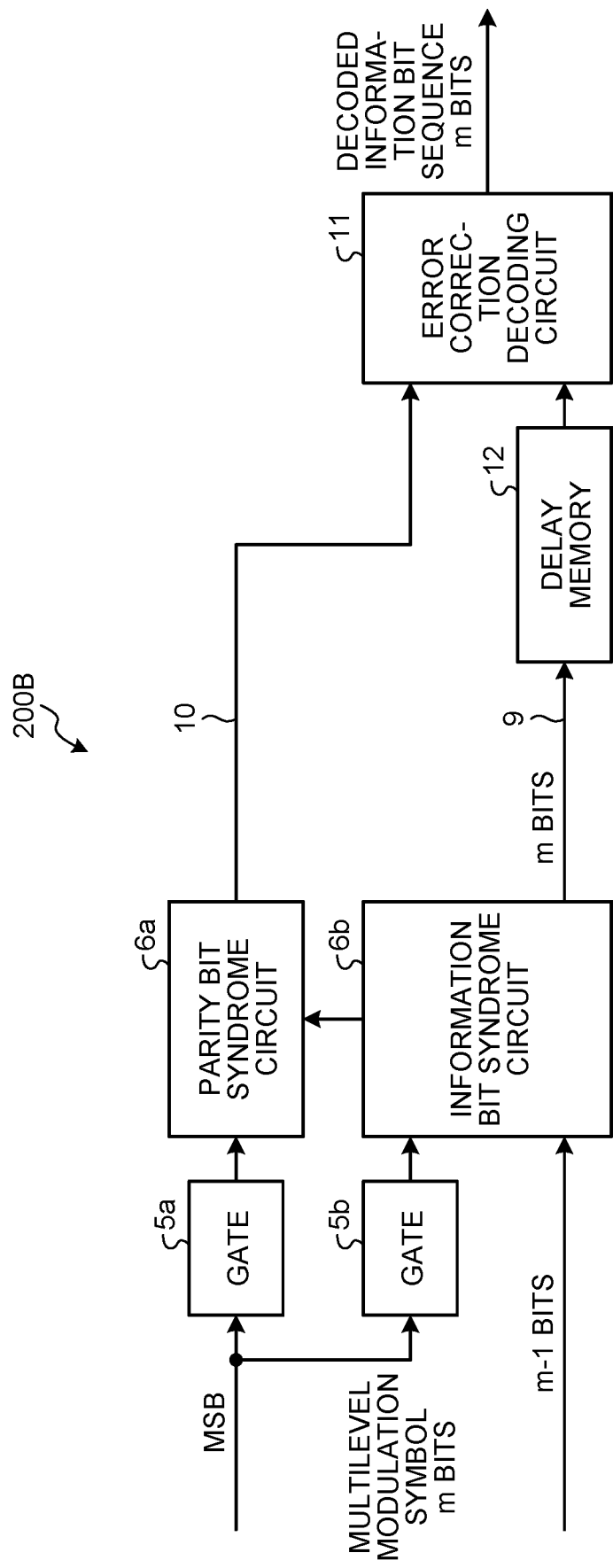
FIG. 9 is a block diagram illustrating an example configuration of an error correction decoding apparatus according to the second embodiment.
Figure 10:
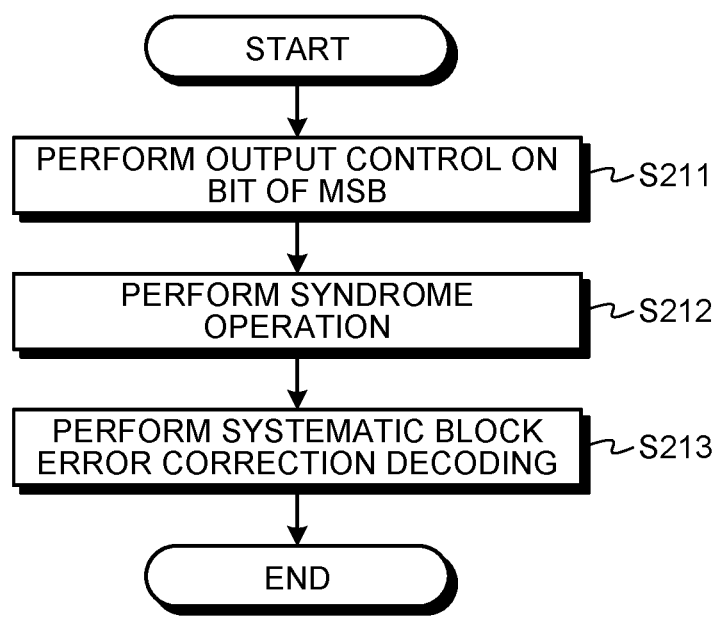
FIG. 10 is a flowchart illustrating an operation of the error correction decoding apparatus according to the second embodiment.

Next, a configuration and an operation of an error correction decoding apparatus that receives and decodes the multilevel modulation symbol transmitted from the error correction coding apparatus 100B will be described. FIG. 9 is a block diagram illustrating an example configuration of an error correction decoding apparatus 200B according to the second embodiment. FIG. 10 is a flowchart illustrating an operation of the error correction decoding apparatus 200B according to the second embodiment. The error correction decoding apparatus 200B is obtained by removing the syndrome correction circuit 7 and the linear addition circuit 8 from the error correction decoding apparatus 200A illustrated in FIG. 4 and adding a delay memory 12 thereto.

In accordance with the bits of the received multilevel modulation symbol, the gates 5a and 5b perform output control on a bit of the MSB 1a including the bit region 1d assigned the parity bits (step S211). The parity bit syndrome circuit 6a performs a syndrome operation, that is, calculates syndrome data, of parity bits. Similarly, the information bit syndrome circuit 6b performs a syndrome operation, that is, calculates syndrome data, of information bits (step S212).

In the error correction decoding apparatus 200B, the input of the information bits is ended at the point of time the syndrome data about the information bits is calculated by the information bit syndrome circuit 6b. The information bit syndrome circuit 6b outputs the syndrome data obtained by the calculation to the parity bit syndrome circuit 6a. When a parity bit sequence is input to the parity bit syndrome circuit 6a, the parity bit syndrome circuit 6a performs a syndrome operation of the error correction code sequence, using the syndrome data about the information bits acquired from the information bit syndrome circuit 6b without via the syndrome correction circuit 7.

At the same time, the information bit syndrome circuit 6b performs a syndrome operation of the information bits of the next error correction code sequence. In addition, the information bit syndrome circuit 6b outputs m bits of the information bits 9. The delay memory 12 adjusts a delay from when the parity bits are input to the parity bit syndrome circuit 6a up to when the syndrome operation of the error correction code sequence is ended. Note that a memory included in the error correction decoding circuit 11 for adjusting a delay for a decoding process may double as the delay memory 12. The error correction decoding circuit 11 performs systematic block error correction decoding (step S213). The error correction decoding apparatus 200B thereafter operates as in the error correction decoding apparatus 200A of the first embodiment. In the second embodiment, as discussed above, the information bit syndrome circuit 6b outputs the syndrome data obtained by the calculation to the parity bit syndrome circuit 6a. The parity bit syndrome circuit 6a performs the syndrome operation of the parity bits, using the syndrome data acquired from the information bit syndrome circuit 6b. The information bit syndrome circuit 6b performs the syndrome operation of the information bits of the next error correction code sequence, that is, the next multilevel modulation symbol, in parallel with the syndrome operation of the parity bits by the parity bit syndrome circuit 6a.

As described above, with the frame configuration of the second embodiment, the circuit scale of the error correction coding apparatus 100B can be reduced because the error correction coding apparatus 100B does not need the delay memories 3b and 3c for delay in outputting the information bits until the parity bits of the error correction code sequence are obtained. In addition, the error correction decoding apparatus 200B includes the parity bit syndrome circuit 6a that performs the same calculations as those performed by the syndrome correction circuit 7 and the linear addition circuit 8 of the error correction decoding apparatus 200A of the first embodiment. For this reason, the circuit scale can be reduced.

It is needless to say that extension of various functions described in the first embodiment can be similarly performed also in the second embodiment.

Third Embodiment

In the first and second embodiments, the known bits are assigned to the bit region 1d before the assignment of the error correction coded parity bits illustrated in FIG. 1 or 6. Instead of the known bits, a third embodiment uses secret bits known only by a sender and an authorized recipient. Consequently, only the authorized recipient receives correct data on an error-occurring communication path and information bits passing therethrough while an unauthorized recipient can reproduce only a part of data including no error. As a result, reception quality can be differentiated between the authorized recipient and the unauthorized recipient. The third embodiment will be hereinbelow described as being applied to the first embodiment, but the third embodiment is applicable to the second embodiment, too.

FIG. 11 is a diagram illustrating an example configuration of a frame 1C used in an error correction code according to the third embodiment. As illustrated in FIG. 11(a), for example, secret p bits of zero are assigned to the bit region 1d before the error correction coding. Note that the state of FIG. 11(b) is similar to the state of FIG. 1(b) described above. In the case of a BCH code using an error correction code for t-bit correction, for example, secret bits having a bit pattern of 1 and 0 including t+1 bits or more results in an error anywhere in the bit pattern of 1 and 0 including t+1 bits or more, and the error cannot be corrected even if the secret bit region is made up of all 0 or all 1. In a BCH code having a large information bit length, the parity bit length required for one-bit correction is large, and in a case of multi-bit correction, the parity bit length p bits are sufficiently larger than 2×(t+1).

Figure 12:
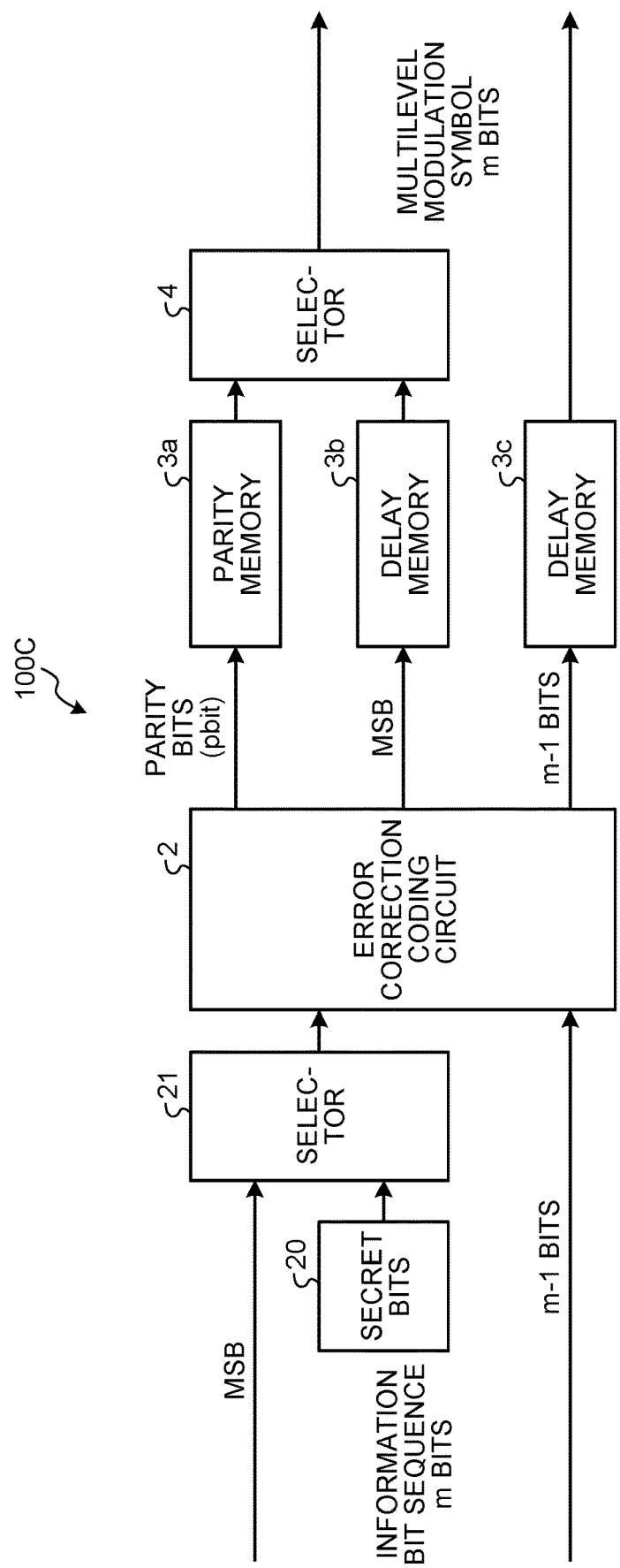
FIG. 12 is a block diagram illustrating an example configuration of an error correction coding apparatus according to the third embodiment.
Figure 13:
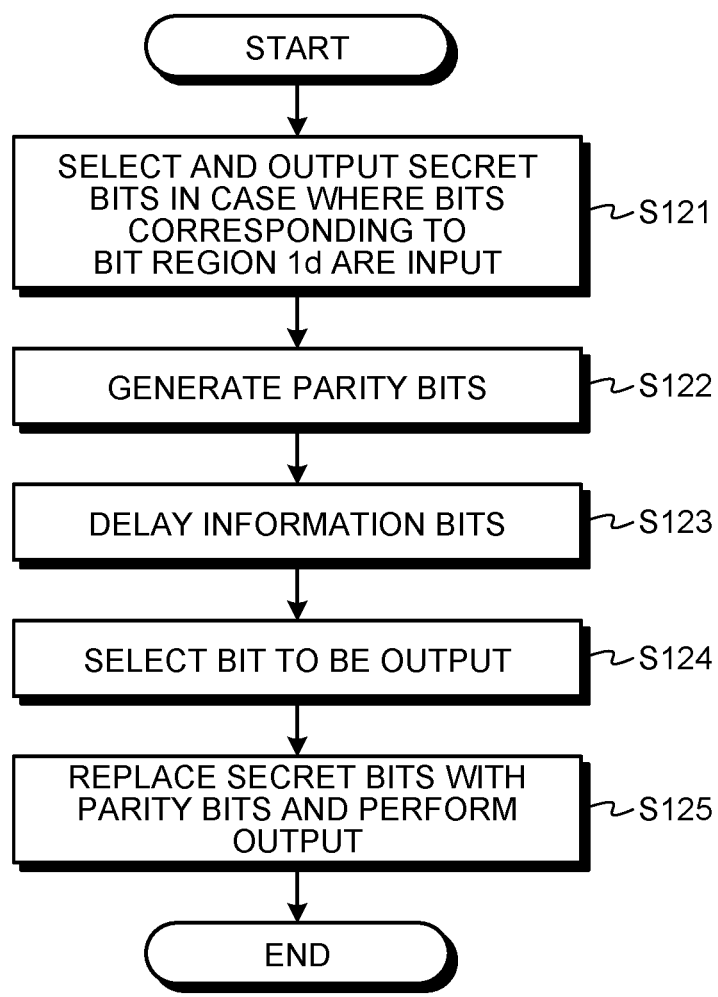
FIG. 13 is a flowchart illustrating an operation of the error correction coding apparatus according to the third embodiment.

A configuration and an operation of an error correction coding apparatus that performs error correction coding on the frame 1C before error correction coding illustrated in FIG. 11(a) will be described. FIG. 12 is a block diagram illustrating an example configuration of an error correction coding apparatus 100C according to the third embodiment. FIG. 13 is a flowchart illustrating an operation of the error correction coding apparatus 100C according to the third embodiment. The error correction coding apparatus 100C is obtained by adding a selector 21 to the error correction coding apparatus 100A illustrated in FIG. 2. The selector 4 may be hereinafter referred to as a first selector, and the selector 21 as a second selector.

The selector 21 is a two-input-one-output selector. In a case where bits corresponding to the bit region 1d illustrated in FIG. 11(a) are input to the selector 21, the selector 21 selects and outputs secret bits 20 to the error correction coding circuit 2 (step S121). In a case where the information bit of the information bit region 1e illustrated in FIG. 11(a) is input to the selector 21, the selector 21 selects and outputs the information bit to the error correction coding circuit 2. Thus, the selector 21 replaces the bits corresponding to the bit region 1d, with the secret bits 20. That is, the selector 21 replaces the bits corresponding to the region having been assigned the known bits in the error correction code sequence, with the secret bits 20. The selector 21 thereafter outputs the secret bits 20 to the error correction coding circuit 2. The operations of subsequent steps S122 to S125 are similar to the above-described operations of steps S101 to S104 illustrated in FIG. 3.

Figure 14:
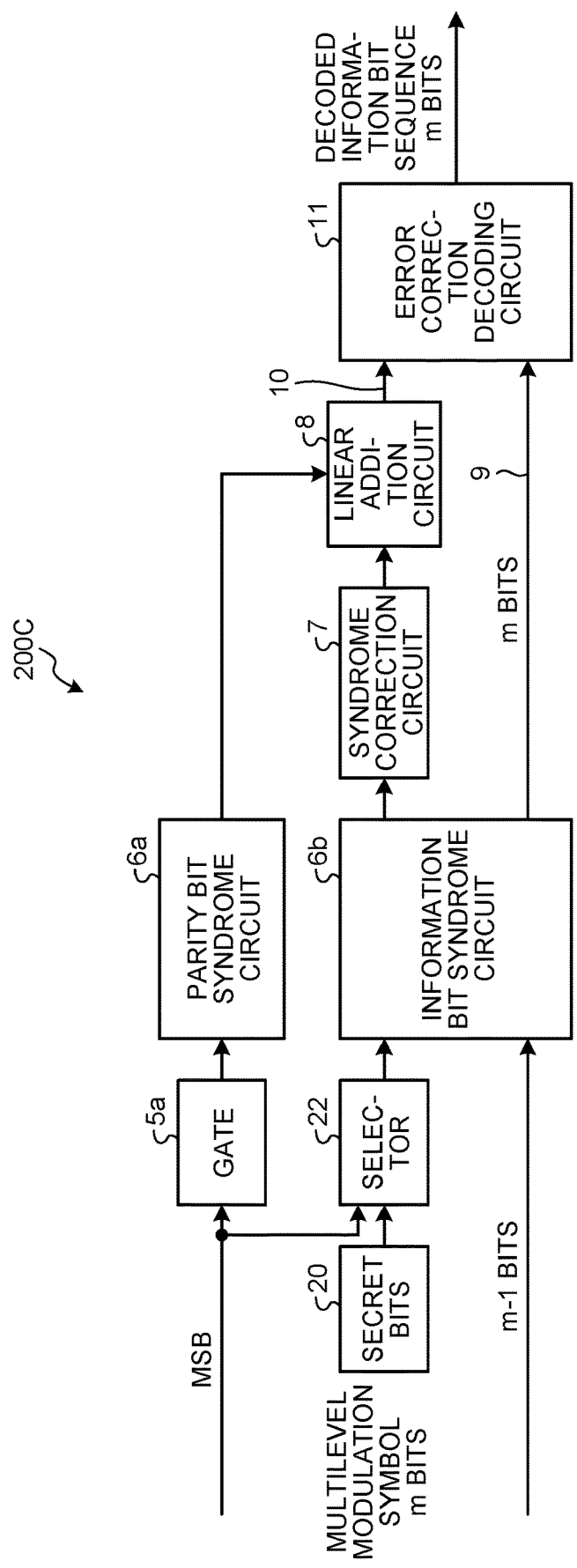
FIG. 14 is a block diagram illustrating an example configuration of an error correction decoding apparatus according to the third embodiment.
Figure 15:
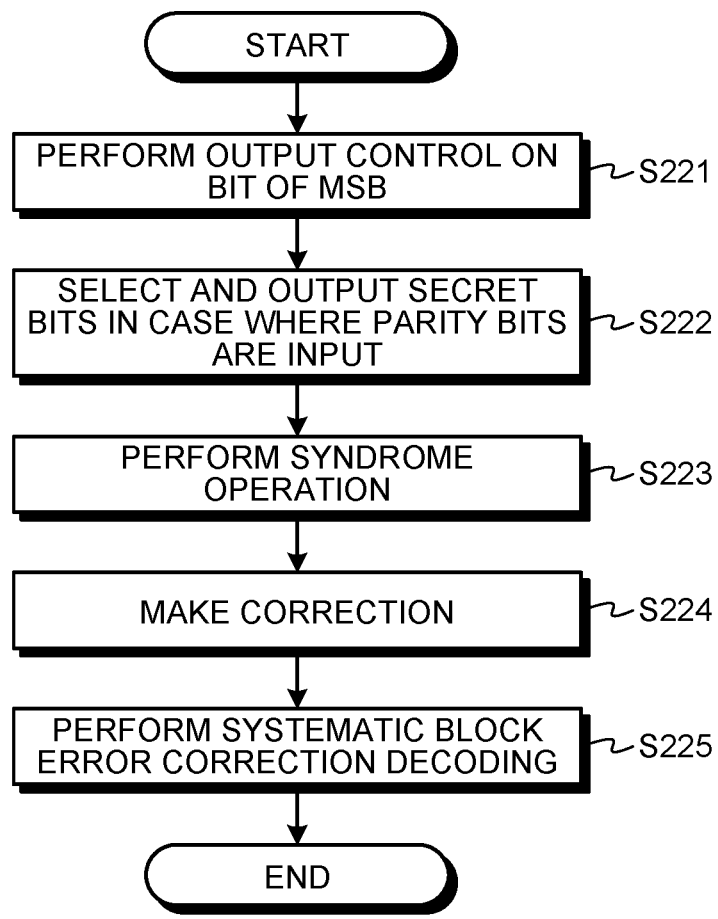
FIG. 15 is a flowchart illustrating an operation of the error correction decoding apparatus according to the third embodiment.

Next, a configuration and an operation of an error correction decoding apparatus that receives and decodes a multilevel modulation symbol transmitted from the error correction coding apparatus 100C will be described. FIG. 14 is a block diagram illustrating an example configuration of an error correction decoding apparatus 200C according to the third embodiment. FIG. 15 is a flowchart illustrating an operation of the error correction decoding apparatus 200C according to the third embodiment. The error correction decoding apparatus 200C decodes the multilevel modulation symbol having been subjected to the error correction coding by the error correction coding apparatus 100C replacing, with the secret bits 20, the bits corresponding to the bit region 1d, i.e., the region having been assigned the known bits before the error correction coding. The error correction decoding apparatus 200C is obtained by removing the gate 5b from the error correction decoding apparatus 200A illustrated in FIG. 4, and adding a selector 22 thereto.

The operation of the gate 5a of step S221 is similar to the above-described operation of step S201 illustrated in FIG. 5. The selector 22 is a two-input-one-output selector. In a case where the error correction coded parity bits assigned to the bit region 1d illustrated in FIG. 11(b) are input to the selector, the selector 22 selects and outputs the secret bits 20 to the information bit syndrome circuit 6b (step S222). In a case where the information bit of the information bit region 1e illustrated in FIG. 11 is input to the selector 22, the selector 22 selects and outputs the information bit to the information bit syndrome circuit 6b. The operations of subsequent steps S223 to S225 are similar to the above-described operations of steps S202 to S204 illustrated in FIG. 5. However, in step S223, the information bit syndrome circuit 6b performs the syndrome operation using the secret bits 20 instead of the known bits.

As described above, the error correction coding apparatus 100C and the error correction decoding apparatus 200C, which are simply modified error correction coding apparatus 100A and simply modified error correction decoding apparatus 200A, respectively, handle the secret bits 20 so as to differentiate the reception quality between an authorized recipient and an unauthorized recipient.

It is needless to say that extension of various functions described in the first embodiment can be similarly performed also in the third embodiment.

Fourth Embodiment

A hardware configuration of the error correction coding apparatuses 100A, 100B, and 100C and the error correction decoding apparatuses 200A, 200B, and 200C described in the first to third embodiments will be described. The error correction coding apparatuses 100A, 100B, and 100C and the error correction decoding apparatuses 200A, 200B, and 200C are each implemented by processing circuitry. The processing circuitry may be a processor that executes a program stored in a memory and the memory, or may be dedicated hardware. The processing circuitry is also referred to as a control circuit.

Figure 16:
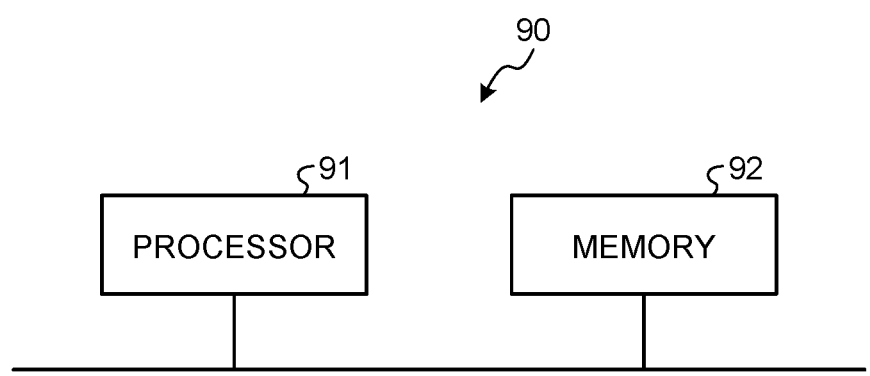
FIG. 16 is a diagram illustrating an example configuration of processing circuitry in a case where a processing circuitry included in each of the error correction coding apparatuses and the error correction decoding apparatuses according to the first to third embodiments is implemented by a processor and a memory.

FIG. 16 is a diagram illustrating an example configuration of processing circuitry 90 in a case where processing circuitry included in each of the error correction coding apparatuses 100A, 100B, and 100C and the error correction decoding apparatuses 200A, 200B, and 200C according to the first to third embodiments is implemented by a processor and a memory. The processing circuitry 90 illustrated in FIG. 16 is a control circuit, and includes a processor 91 and a memory 92. When the processing circuitry 90 is made up of the processor 91 and the memory 92, functions of the processing circuitry 90 are implemented by software, firmware, or a combination of software and firmware. The software or the firmware is described as a program and stored in the memory 92. In the processing circuitry 90, the processor 91 reads and executes the program stored in the memory 92, thereby implementing the functions. That is, the processing circuitry 90 includes the memory 92 for storing a program that results in execution of a process of any one of the error correction coding apparatuses 100A, 100B, and 100C and the error correction decoding apparatuses 200A, 200B, and 200C. It can also be said that this program is a program for causing any one of the error correction coding apparatuses 100A, 100B, and 100C and the error correction decoding apparatuses 200A, 200B, and 200C to execute the functions implemented by the processing circuitry 90. This program may be provided by a storage medium having the program stored therein, or may be provided by other means such as a communication medium.

The processor 91 is, for example, a central processing unit (CPU), a processing device, an arithmetic device, a microprocessor, a microcomputer, a digital signal processor (DSP), or the like. The memory 92 corresponds to, for example, a non-volatile or volatile semiconductor memory such as a random access memory (RAM), a read only memory (ROM), a flash memory, an erasable programmable ROM (EPROM), or an electrically EPROM (EEPROM (registered trademark)), a magnetic disk, a flexible disk, an optical disk, a compact disc, a mini disk, or a digital versatile disc (DVD).

Figure 17:
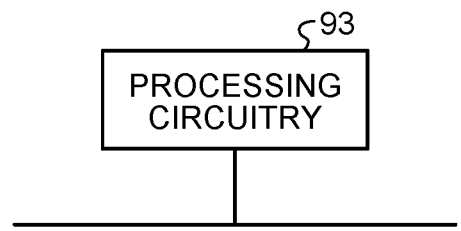
FIG. 17 is a diagram illustrating an example of a processing circuitry in a case where processing circuitry included in each of the error correction coding apparatuses and the error correction decoding apparatuses according to the first to third embodiments is defined by dedicated hardware.

FIG. 17 is a diagram illustrating an example of processing circuitry 93 in a case where processing circuitry included in each of the error correction coding apparatuses 100A, 100B, and 100C and the error correction decoding apparatuses 200A, 200B, and 200C according to the first to third embodiments is made of dedicated hardware. The processing circuitry 93 illustrated in FIG. 17 corresponds to, for example, a single circuit, a composite circuit, a programmed processor, a parallel programmed processor, an application specific integrated circuit (ASIC), a field programmable gate array (FPGA), or a combination thereof. A part of the processing circuitry may be implemented by dedicated hardware and another part thereof may be implemented by software or firmware. Thus, the processing circuitry can implement each of the above-described functions by dedicated hardware, software, firmware, or a combination thereof.

Fifth Embodiment

In a fifth embodiment described below, the configuration for the error correction coding on a multilevel modulation symbol is used for the error correction coding on a multilevel modulation symbol with different modulation levels, for example, 64 QAM, 16 QAM, etc. Although the first to third embodiments are applicable in the fifth embodiment, the description will be made in relation to the error correction coding apparatus 100A and the error correction decoding apparatus 200A of the first embodiment by way of example.

Figure 18:
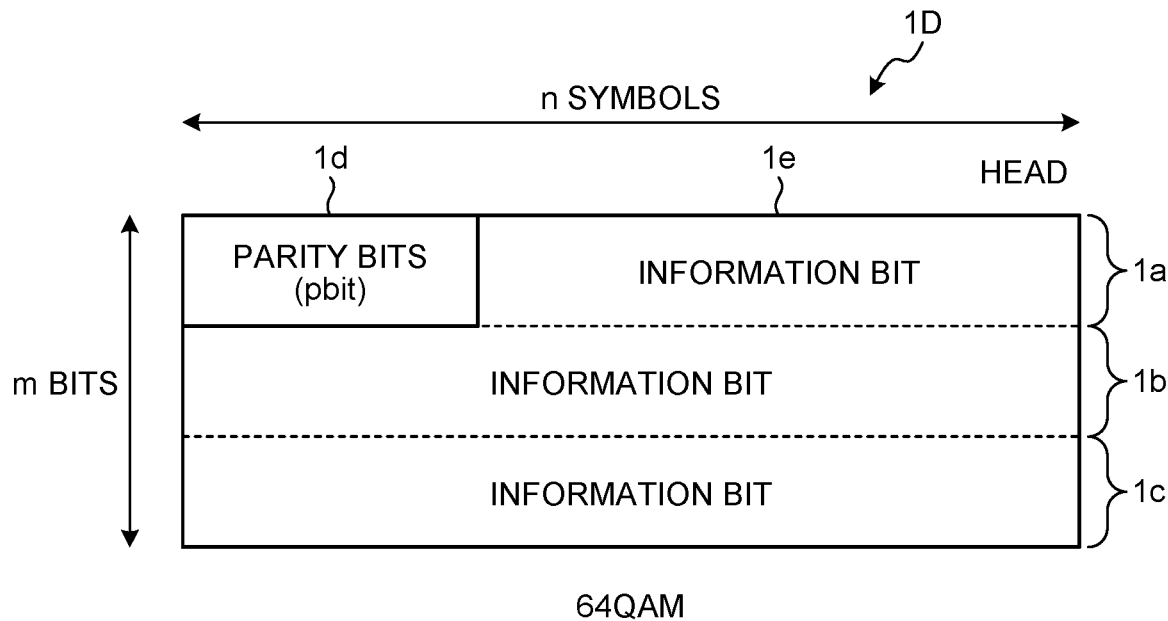
FIG. 18 is a diagram illustrating an example configuration of a frame used in a case of 64 QAM in an error correction code according to a fifth embodiment.
Figure 19:
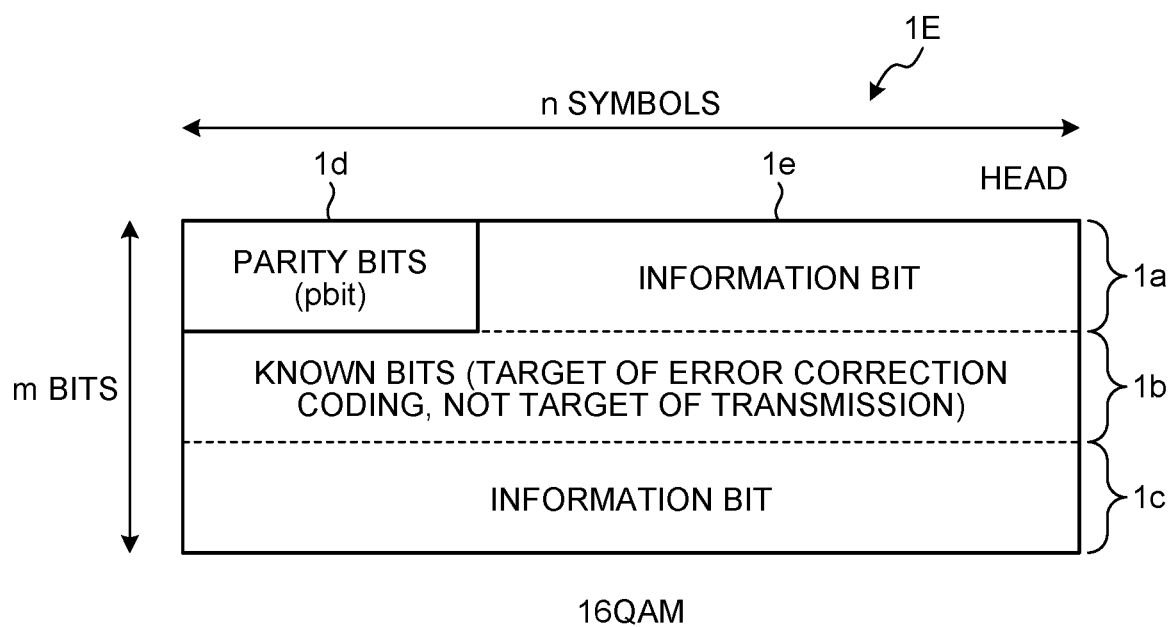
FIG. 19 is a diagram illustrating an example configuration of a frame used in a case of 16 QAM in an error correction code according to the fifth embodiment.

FIG. 18 is a diagram illustrating an example configuration of a frame 1D used in a case of 64 QAM in an error correction code according to the fifth embodiment. FIG. 19 is a diagram illustrating an example configuration of a frame 1E used in a case of 16 QAM in an error correction code according to the fifth embodiment. FIGS. 18 and 19 illustrate states of the frames after coding. FIG. 18 illustrates a configuration of a 64-QAM multilevel modulation symbol after error correction coding, assuming that the number of bits m of the multilevel modulation symbol, which is the number of symbol bits of each of Ich and Qch of the multilevel modulation symbol, is set to 3 (m=3) such that each of Ich and Qch of the 64-QAM multilevel modulation symbol is three bits. FIG. 19 illustrates the multilevel modulation symbol in FIG. 18 with Ich and Qch each changed to be two bits for transmission with 16 QAM. FIG. 19 illustrates, for example, the frame including the MSB 1a and the LSB 1c of Ich and Qch as 16-QAM symbols and the intermediate bit 1b of Ich and Qch having known bits inserted therein but not transmitted, such that the error correction coding is performed on the frame in the same manner as 64 QAM. The known bits are, for example, fixed bits of zero as in the first embodiment and the like. In the fifth embodiment, the error correction coding apparatus 100A generates and transmits the frame 1D illustrated in FIG. 18 or the frame 1E illustrated in FIG. 19. The intermediate bit 1b of the frame 1E illustrated in FIG. 19 is excluded from transmission target.

As described above, the error correction code sequence is defined by a multilevel modulation symbol having a maximum of m bits and n symbols in parallel. In this case, when a multilevel modulation symbol of less than m bits is input with n symbols in parallel, the error correction coding circuit 2 of the error correction coding apparatus 100A inserts the known bits into, among the m bits, the bit to which the parity bit is to be not assigned, and performs the same error correction coding as that performed on the m-bit multilevel modulation symbol. In transmitting an error correction code sequence, the error correction coding apparatus 100A excludes the known bits from the transmission target, i.e., the error correction code sequence, such that the error correction coding apparatus 100A transmits the error correction code sequence in the form of the multilevel modulation symbol of less than m bits.

When receiving the frame 1D illustrated in FIG. 18, the error correction decoding apparatus 200A performs decoding with the error correction code through the operation similar to that in the first embodiment. On the other hand, when receiving the frame 1E illustrated in FIG. 19, the error correction decoding apparatus 200A can perform the decoding with the error correction code through the operation similar to that of the first embodiment by inserting the known bits into the intermediate bit 1b that has not been transmitted and performing error correction decoding. At that time, in the error correction decoding apparatus 200A, no error occurs in the known intermediate bit 1b, so that there is no disadvantage in the error correction decoding. In addition, when a correction is made to the known intermediate bit 1b that is known, such a correction is obviously an erroneous correction. As a result, the error correction decoding apparatus 200A can determine that the correction should not have been made. As described above, the error correction decoding circuit 11 of the error correction decoding apparatus 200A inserts the known bits into the portion having the known bits excluded by the error correction coding apparatus 100A from the transmission target, i.e., the error correction code sequence, such that the error correction decoding circuit 11 performs the error correction decoding using the frame of m bits× n symbols as the error correction code sequence. As described above, according to the present embodiment, even when required to have a function of changing to the setting for a different multilevel modulation symbol, the error correction coding apparatus 100A can still use the error correction coding circuit 2 as an element for coding, and the error correction decoding apparatus 200A can still use the error correction decoding circuit 11 as an element for decoding without disadvantaging the correction capability thereof.

Although the present embodiment has been described in relation to 64 QAM by way of example, needless to say, it is possible for the present embodiment to support a multilevel modulation symbols with m=4 for 256 QAM or m much larger for (2 to the 2m-th power) QAM, for example. In addition, it is possible to support even odd-numbered bit symbol modulation such as 32 QAM for a multilevel modulation symbol having the odd number of bits, as the multilevel modulation symbol is treated as a multilevel modulation symbol with more one bit as a known bit.

In the present embodiment, the error correction coding apparatus 100A and the error correction decoding apparatus 200A are implemented by processing circuitry as described in the fourth embodiment. The processing circuitry may be a processor that executes a program stored in a memory and the memory, or may be dedicated hardware.

It is needless to say that also with the configuration of the frame 1B in the second embodiment, the configuration including multilevel modulation symbols with different modulation levels can be obtained similarly to the present embodiment, and can be implemented using the error correction coding apparatus 100B and the error correction decoding apparatus 200B of the second embodiment. Sixth Embodiment.

In the fifth embodiment, the one type of multilevel modulation symbol is a unit on a basis of which an error correction coding is performed. That is, the multilevel modulation symbol of the one type is the error correction code sequence. A sixth embodiment gives the error correction code sequence having a mixture of multilevel modulation symbols with different modulation levels, as will be described below. Similarly to the fifth embodiment, a description will be given using the error correction coding apparatus 100A and the error correction decoding apparatus 200A of the first embodiment as examples.

Figure 20:
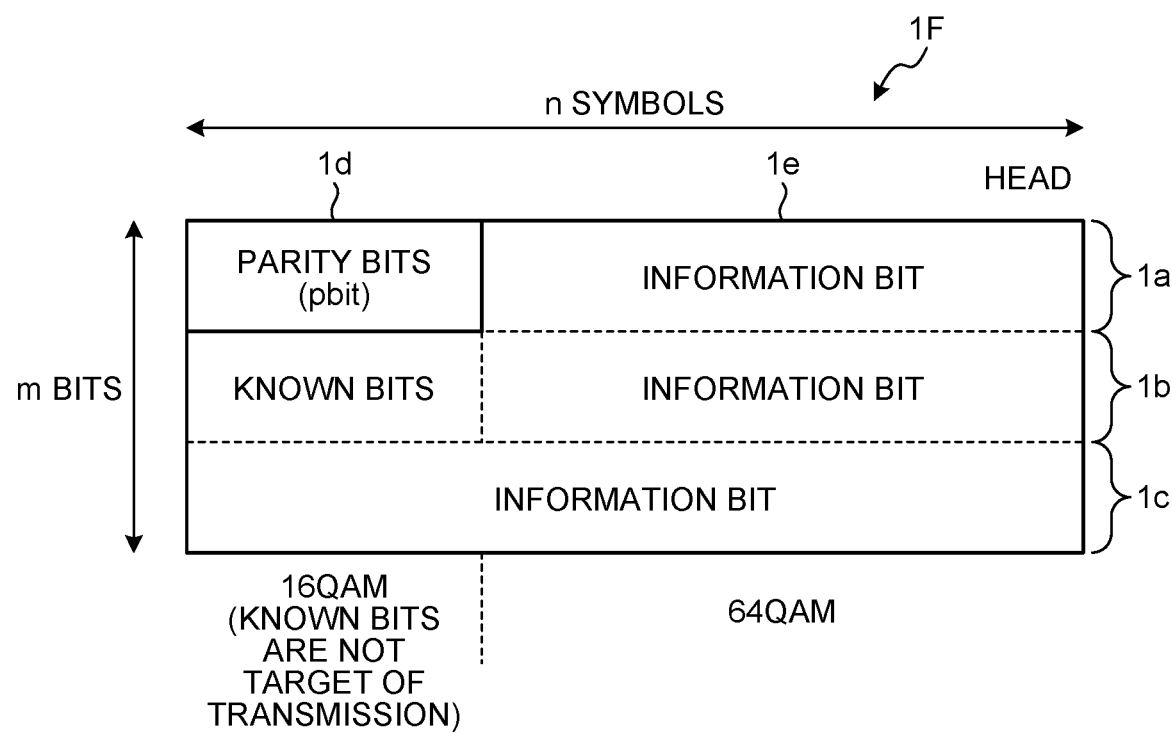
FIG. 20 is a diagram illustrating an example configuration of a frame used in an error correction code according to a sixth embodiment.

FIG. 20 is a diagram illustrating an example configuration of a frame 1F used in an error correction code according to the sixth embodiment. FIG. 20 illustrates a state of the frame after coding. FIG. 20 illustrates a configuration of a 64-QAM multilevel modulation symbol after error correction coding, assuming that the number of bits m of the multilevel modulation symbol, which is the number of symbol bits of each of Ich and Qch of the multilevel modulation symbol, is set to 3 (m=3), such that each of Ich and Qch of the 64-QAM multilevel modulation symbol is three bits. The error correction coding apparatus 100A uses 64 QAM in transmitting a symbol defined by information bits whose symbol-error-probability can be reduced by PS performed before the error correction coding. As for a symbol having parity bits added by error correction coding and providing higher symbol-error-probability when that symbol is transmitted with 64 QAM than a symbol processed by PS, the error correction coding apparatus 100A performs error correction coding, inserting known bits into the intermediate bit 1b in the same time slot in which to assign the parity bits to the MSB 1a, excludes the known bits from the transmission target, and transmits this transmission target with 16 QAM. Consequently, the error correction coding apparatus 100A can reduce the symbol error probability. Similarly to the fifth embodiment, in a case where 64 QAM and 16 QAM are used, the error correction coding apparatus 100A can perform the error correction coding with the same error correction coding circuit 2.

As described above, the error correction code sequence is defined by a multilevel modulation symbol having a maximum of m bits and N symbols in parallel and a multilevel modulation symbol of less than m bits and n-N symbols in parallel, on a time series where N is a positive integer smaller than n. In this case, the error correction coding circuit 2 of the error correction coding apparatus 100A inserts the known bits into the multilevel modulation symbol of less than m bits, and performs the same error correction coding as in the case where the error correction code sequence is defined by a multilevel modulation symbol of m bits having n symbols in parallel. In transmitting an error correction code sequence, the error correction coding apparatus 100A excludes the known bits from the transmission target, i.e., the error correction code sequence, such that the error correction coding apparatus 100A transmits the error correction code sequence in the form of the multilevel modulation symbol of less than m bits.

The error correction decoding apparatus 200A can also perform decoding with the same error correction decoding circuit 11 by inserting the same known bits as the error correction coding apparatus 100A into the intermediate bit 1b of a 16-QAM symbol at the time of reception. As described above, the error correction decoding circuit 11 of the error correction decoding apparatus 200A inserts the known bits into the portion having the known bits excluded by the error correction coding apparatus 100A from the transmission target, i.e., the error correction code sequence, and performs the error correction decoding using the frame of m bits× n symbols as the error correction code sequence.

As described above, according to the present embodiment, even in a case where different multilevel modulation symbols are mixed in a time-division manner, the error correction coding apparatus 100A can still use the error correction coding circuit 2 as an element for coding, and the error correction decoding apparatus 200A can still use the error correction decoding circuit 11 as an element for decoding. Although the error correction coding apparatus 100A in this embodiment assigns the parity bits to the MSB 1a of Ich and Qch of 16 QAM, the error correction coding apparatus 100A can perform a similar operation, assigning the parity bits to the LSB 1c by QPSK, for example. In this case, with the parity bits in the LSB brought to the MSB, the error correction coding apparatus 100A can be used. The same applies to the error correction decoding apparatus 200A.

Similarly to the fifth embodiment, needless to say, it is possible for the present embodiment to support a multilevel modulation symbol with m=4 for 256 QAM or m much larger for (2 to the 2m-th power) QAM, for example. It is possible for the present embodiment to apply where an odd-numbered bit symbol is mixed in the frame. Furthermore, in the present embodiment, the intermediate bit 1b can be used as a secret key.

In the present embodiment, the error correction coding apparatus 100A and the error correction decoding apparatus 200A are implemented by processing circuitry as described in the fourth embodiment. The processing circuitry may be a processor that executes a program stored in a memory and the memory, or may be dedicated hardware.

It is needless to say that also with the configuration of the frame 1B in the second embodiment, the configuration including multilevel modulation symbols with different modulation levels can be obtained similarly to the present embodiment, and can be implemented using the error correction coding apparatus 100B and the error correction decoding apparatus 200B of the second embodiment.

Seventh Embodiment

In the fifth embodiment described above, the one type of multilevel modulation symbol is a unit on a basis of which the error correction coding is performed. That is, the multilevel modulation symbol of the one type is the error correction code sequence. The sixth embodiment gives the error correction coding for the multilevel modulation symbol time-divided into multilevel modulation symbols with different modulation levels. In a seventh embodiment, a description will be made as to using the configuration of the error correction coding circuit 2 and the configuration of the error correction decoding circuit 11 as in the fifth embodiment and the sixth embodiment, in dealing with a plurality of carriers, i.e., a plurality of carrier waves for different modulation levels of multilevel modulation symbols at the same timing in one error correction coding sequence. Similarly to the fifth embodiment, a description will be given in relation to the error correction coding apparatus 100A and the error correction decoding apparatus 200A of the first embodiment by way of example.

Figure 21:
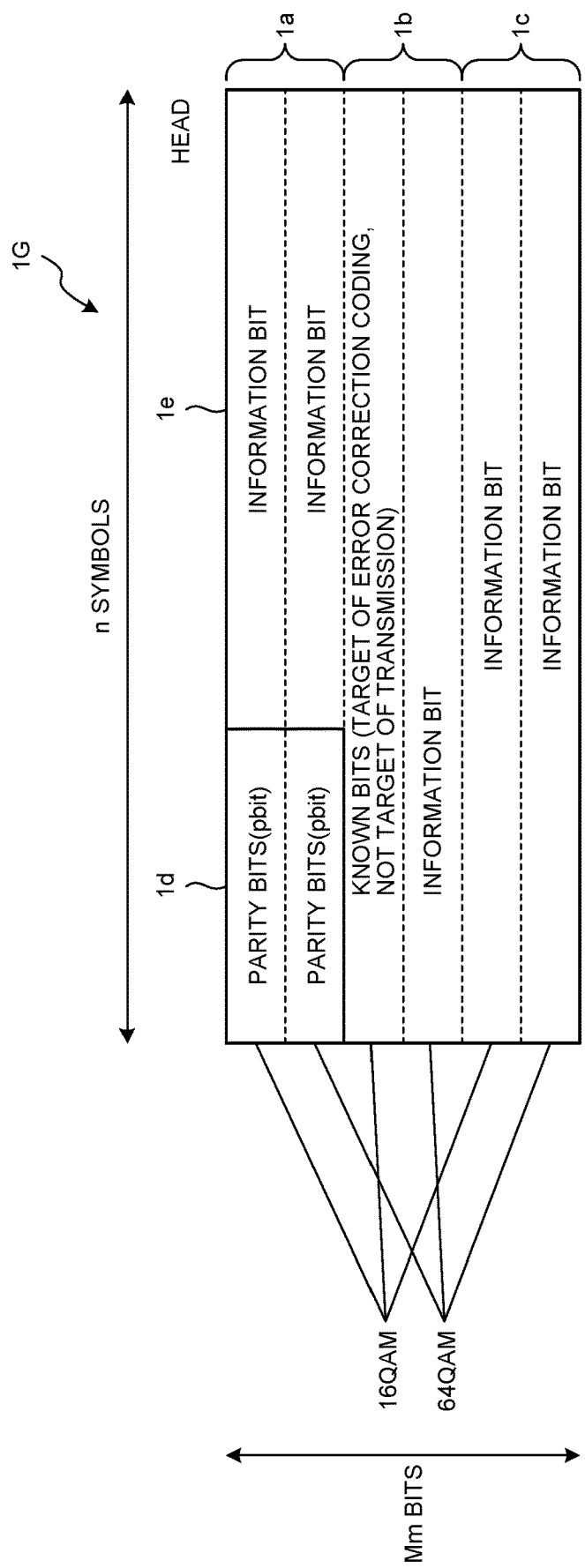
FIG. 21 is a diagram illustrating an example configuration of a frame used in an error correction code according to a seventh embodiment.

FIG. 21 is a diagram illustrating an example configuration of a frame 1G used in an error correction code according to the seventh embodiment. FIG. 21 illustrates a state of the frame after coding. In FIG. 21, the number of bits m of the multilevel modulation symbol is set to 3 as the number of symbol bits of each of Ich and Qch of the multilevel modulation symbol, and M as the number of symbols of Ich and Qch to be input in parallel is set to 2. In FIG. 21, one multilevel modulation symbol (m=3) is defined as corresponding to a carrier wave transmitted with a 64-QAM multilevel modulation symbol, and the other multilevel modulation symbol (m=3) is defined as corresponding to a carrier wave transmitted with a 16-QAM multilevel modulation symbol. In FIG. 21, the symbols includes two 64-QAM multilevel modulation symbol symbols in parallel for error correction coding. Of these, the MSB 1a, the LSB 1c, and the intermediate bit 1b of the 64-QAM multilevel modulation symbol are assigned bits similar to the bits illustrated in FIG. 18. The MSB 1a, the LSB 1c, and the intermediate bit 1b of the 16-QAM multilevel modulation symbol are assigned bits similar to the bits illustrated in FIG. 19. As described above, the known bits are inserted into the intermediate bit 1b of the 16-QAM multilevel modulation symbol, which is excluded from a transmission target. Similarly to the fifth embodiment, in a case where 64 QAM and 16 QAM are used, the error correction coding apparatus 100A can perform the error correction coding with the error correction coding circuit 2.

As described above, the error correction code sequence is defined by a frame of m bits× n symbols input in Mm-bit parallel, where M is a positive integer. In this case, the error correction coding circuit 2 of the error correction coding apparatus 100A inserts the known bits into, among M multilevel modulation symbols, a multilevel modulation symbol of less than m bits, and performs the error correction coding on Mm bits× n symbols. In transmitting the error correction code sequence, the error correction coding apparatus 100A excludes the known bits from a transmission target, i.e., the error correction code sequence, such that the error correction coding apparatus 100A transmits the error correction code sequence in the form of the multilevel modulation symbol of less than m bits.

When receiving the frame 1G illustrated in FIG. 21, the error correction decoding apparatus 200A performs decoding with the error correction code through the operation on the 64-QAM multilevel modulation symbol portion of the frame 1G, as in the first embodiment. When receiving the frame 1G illustrated in FIG. 21, also, the error correction decoding apparatus 200A performs error correction decoding, inserting the known bits into the intermediate bit 1b of the 16-QAM multilevel modulation symbol portion that has not been transmitted, such that the error correction decoding apparatus 200A can perform the decoding with the error correction code through the operation similar to that of the first embodiment. Similarly to the fifth embodiment, in a case where 64 QAM and 16 QAM are used, the error correction decoding apparatus 200A can perform the decoding with the same error correction decoding circuit 11. As described above, the error correction decoding circuit 11 of the error correction decoding apparatus 200A inserts the known bits into the portion having the known bits excluded by the error correction coding apparatus 100A from the transmission target, i.e., the error correction code sequence, and performs the error correction decoding using the frame of Mm bits× n symbols as the error correction code sequence, the Mm bits being an integral multiple of m bits.

Note that the error correction decoding circuit 11 of the error correction decoding apparatus 200A may obtain soft decision information A in the process of the error correction decoding. In a case where M and A are positive integers, the error correction decoding circuit 11 of the error correction decoding apparatus 200A may insert the known bits into the portion having the known bits excluded by the error correction coding apparatus 100A from the transmission target, i.e., the error correction code sequence, and perform the error correction decoding using, as the error correction code sequence, a frame of MmA bits×n symbols including the soft decision information A and input in MmA-bit parallel, the MmA bits being an integral multiple of m bits.

As described above, according to the present embodiment, even in a case where a mixture of different multilevel modulation symbols are arranged in parallel, that is, at the same timing, the error correction coding apparatus 100A can still use the error correction coding circuit 2 as an element for coding, and the error correction decoding apparatus 200A can still use the error correction decoding circuit 11 as an element for decoding. In the present embodiment, the error correction coding apparatus 100A and the error correction decoding apparatus 200A can flexibly deal with a change, if any, in the number of bits of the multilevel modulation symbol of each carrier wave.

Similarly to the fifth embodiment, needless to say, it is possible for the present embodiment to support a multilevel modulation symbol with m=4 for 256 QAM or m much larger for (2 to the 2m-th power) QAM, for example. It is possible for the present embodiment to apply where an odd-numbered bit symbol is mixed in the frame. Furthermore, in the present embodiment, the intermediate bit 1b can be used as a secret key.

In the present embodiment, the error correction coding apparatus 100A and the error correction decoding apparatus 200A are implemented by processing circuitry as described in the fourth embodiment. The processing circuitry may be a processor that executes a program stored in a memory and the memory, or may be dedicated hardware.

It is needless to say that also with the configuration of the frame 1B in the second embodiment, the configuration including multilevel modulation symbols with different modulation levels can be obtained similarly to the present embodiment, and can be implemented using the error correction coding apparatus 100B and the error correction decoding apparatus 200B of the first embodiment.

The error correction coding apparatus according to the present disclosure achieves an effect of performing the error correction coding process with low latency as well as preventing the increase in circuit scale.

The configurations described in the embodiments above are merely examples and can be combined with other known technology, embodiments can be combined with each other, and part of the configurations can be omitted or modified without departing from the gist thereof.

What is claimed is:

1. An error correction coding apparatus to perform error correction coding using, as an error correction code sequence, a frame of m bits× n parallel symbols defining a multilevel symbol and input in m-bit parallel, where m and n are positive integers, the apparatus comprising:

an error correction coding circuit to perform error correction coding using, as information bits, m bits× n symbols including known bits of the frame assigned to a bit sequence specified in the error correction code sequence and generate error correction coded parity bits; and a selector to replace the known bits of the error correction code sequence with the parity bits, wherein the known bits in the frame of the error correction sequence have a bit state that is a coding target the bit state being recognized in advance by a transmission side and a reception side in common.

2. The error correction coding apparatus according to claim 1, wherein the selector replaces known bits of a second error correction code sequence with parity bits generated from a first error correction code sequence by the error correction coding circuit, the second error correction code sequence being subsequent to the first error correction code sequence.

3. The error correction coding apparatus according to claim 1, wherein the selector is a first selector, and the apparatus further comprising:

a second selector to replace bits corresponding to a region assigned the known bits in the error correction code sequence, with secret bits and to output the secret bits to the error correction coding circuit.

4. The error correction coding apparatus according to claim 1, wherein a number of bits input in parallel is m bits or a multiple of m bits, and an information bit length is divided by m bits or a multiple of m bits, and the error correction coding circuit generates the parity bits by simultaneous calculation using bits input in parallel.

5. The error correction coding apparatus according to claim 1, wherein the error correction code sequence is defined by a multilevel modulation symbol having a maximum of m bits and n symbols in parallel;

when a modulation symbol of less than the m bits is input with n symbols in parallel, the error correction coding circuit inserts known bits into, among the m bits, a bit to which the parity bits are to be not assigned, and performs same error correction coding as that performed on an m-bit multilevel modulation symbol, and in transmitting the error correction code sequence, the error correction coding apparatus excludes the known bits from a transmission target that is the error correction code sequence, such that the error correction coding apparatus transmits the error correction code sequence in the form of the multilevel modulation symbol of less than the m bits.

6. The error correction coding apparatus according to claim 1, wherein the error correction code sequence is defined by a multilevel modulation symbol having a maximum of m bits and N symbols in parallel and a multilevel modulation symbol of less than the m bits and n-N symbols in parallel, on a time series where N is an integer smaller than n, the error correction coding circuit inserts known bits into the multilevel modulation symbol of less than the m bits, and performs same error correction coding as in a case where an error correction code sequence is defined by a multilevel modulation symbol of m bits having n symbols in parallel, and in transmitting the error correction code sequence, the error correction coding apparatus excludes the known bits from a transmission target that is the error correction code sequence, such that the error correction coding apparatus transmits the error correction code sequence in the form of the multilevel modulation symbol of less than the m bits.

7. The error correction coding apparatus according to claim 1, wherein the error correction code sequence is defined by a frame of m bits×n symbols input in Mm-bit parallel, where M is a positive integer, the error correction coding circuit inserts known bits into, among M multilevel modulation symbols, a multilevel modulation symbol of less than m bits, and performs error correction coding on Mm bits× n symbols, and in transmitting the error correction code sequence, the error correction coding apparatus excludes the known bits from a transmission target that is the error correction code sequence, such that the error correction coding apparatus transmits the error correction code sequence in the form of the multilevel modulation symbol of less than the m bits.

* * * * *